US009666252B2

(12) United States Patent
Yoshimura et al.

(10) Patent No.: US 9,666,252 B2
(45) Date of Patent: May 30, 2017

(54) SEMICONDUCTOR DEVICE FOR CALCULATING AN INTERACTION MODEL

(71) Applicant: Hitachi, Ltd., Tokyo (JP)

(72) Inventors: Chihiro Yoshimura, Tokyo (JP); Masanao Yamaoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/642,047

(22) Filed: Mar. 9, 2015

(65) Prior Publication Data

US 2016/0064050 A1   Mar. 3, 2016

(30) Foreign Application Priority Data

Aug. 29, 2014 (JP) .................. 2014-176534

(51) Int. Cl.
  *G11C 7/12* (2006.01)
  *G11C 5/14* (2006.01)
  *G11C 5/02* (2006.01)
  *G11C 8/10* (2006.01)
  *G11C 8/08* (2006.01)
  *G11C 11/41* (2006.01)
  *G06N 7/00* (2006.01)
  *G06N 99/00* (2010.01)
  (Continued)

(52) U.S. Cl.
  CPC .............. *G11C 7/12* (2013.01); *G06N 7/005* (2013.01); *G11C 5/02* (2013.01); *G11C 5/147* (2013.01); *G11C 8/08* (2013.01); *G11C 8/10* (2013.01); *G11C 11/412* (2013.01); *G11C 11/419* (2013.01); *G06N 99/002* (2013.01)

(58) Field of Classification Search
  CPC .. G11C 7/12; G11C 8/10; G11C 5/147; G11C 5/02
  See application file for complete search history.

(56) References Cited

U.S. PATENT DOCUMENTS 6,551,846 B1 *  4/2003  Furutani ................. H01L 22/34
                                                         257/48
6,704,231 B1 *  3/2004  Morishita .............. G11C 29/12
                                                         365/201
(Continued)

FOREIGN PATENT DOCUMENTS

JP     59-223991 A    12/1984
JP     11-338767 A    12/1999
(Continued)

*Primary Examiner* — J. H. Hur
(74) *Attorney, Agent, or Firm* — Volpe and Koenig, P.C.

(57) ABSTRACT

A semiconductor device includes a spin array in which a plurality of memory cells are disposed in a matrix configuration, a group of a predetermined number of memory cells is collected in units of spin units, and a plurality of the spin units are disposed with an adjacency; a word line provided in correspondence with rows of the memory cells; a bit line pair provided in correspondence with columns of the memory cells; a multiword decoder configured to multiplex a word address according to an input of a multiplicity specify signal to a word line and simultaneously activate a plurality of word lines; and a bit line driver configured to subject a plurality of memory cells, of the memory cells connected to bit line pairs and arrayed in a column direction, activated by the plurality of word lines to a write operation or a read operation.

11 Claims, 38 Drawing Sheets

(51) Int. Cl.
*G11C 11/412* (2006.01)
*G11C 11/419* (2006.01)

(56) References Cited

U.S. PATENT DOCUMENTS

| | | | |
|---|---|---|---|
| 2004/0117723 A1* | 6/2004 | Foss | G06F 11/1044 714/805 |
| 2008/0219069 A1* | 9/2008 | Arsovski | G11C 29/50 365/201 |
| 2010/0142300 A1* | 6/2010 | Chen | G11C 29/50 365/201 |
| 2011/0022820 A1 | 1/2011 | Bunyk et al. | |
| 2014/0046626 A1 | 2/2014 | Yamamoto et al. | |

FOREIGN PATENT DOCUMENTS

| | | |
|---|---|---|
| JP | 2001-319496 A | 11/2001 |
| JP | 2011-524026 A | 8/2011 |
| JP | 2012-073954 A | 4/2012 |
| JP | 2014-099225 A | 5/2014 |
| WO | 2012/118064 A | 9/2012 |

\* cited by examiner

SPIN UNIT 300

- ⊕ SPIN
- ▭ INTERACTION COEFFICIENT
- ☐ EXTERNAL MAGNETIC FIELD COEFFICIENT

OMISSION

FIG. 11
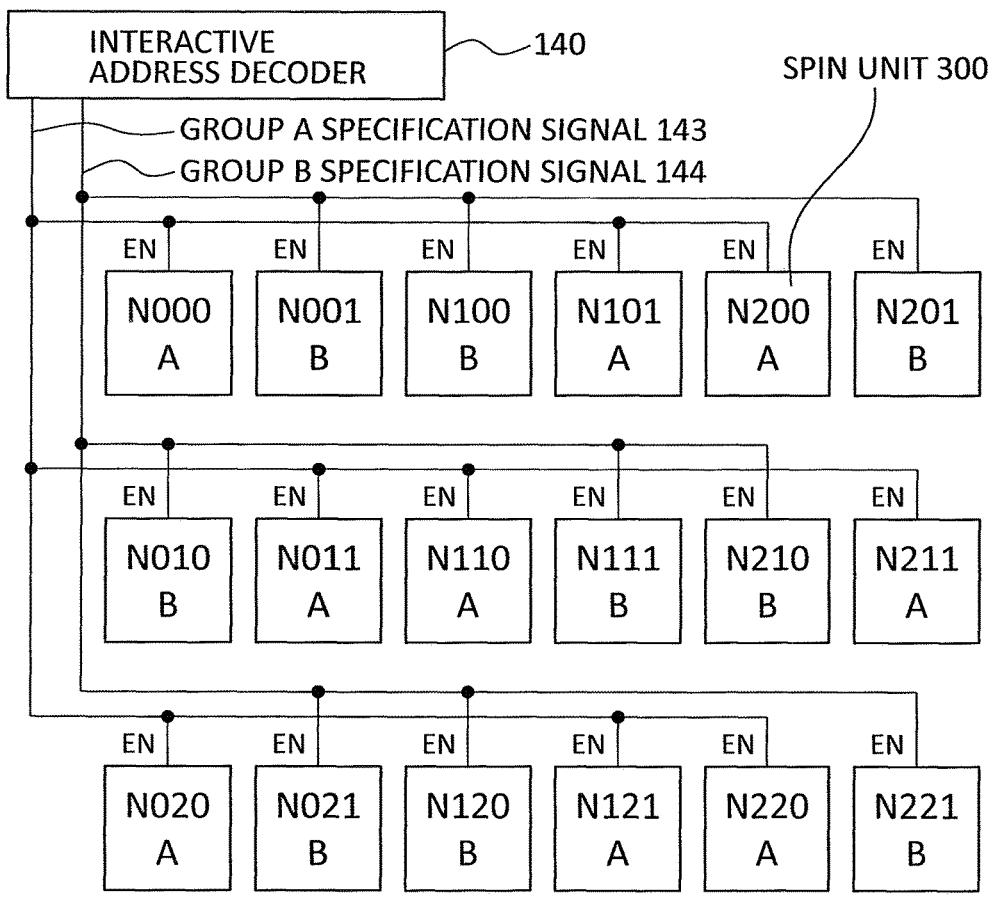
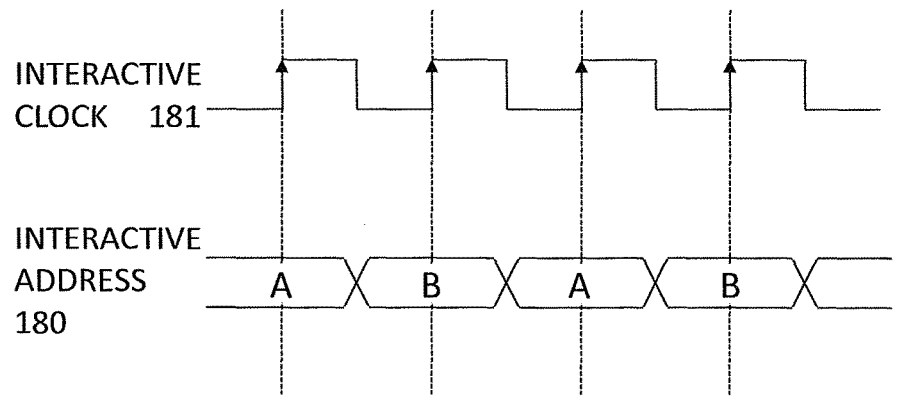

RATE OF OCCURRENCE OF BIT ERROR IN MEMORY CELL WHEN VOLTAGE IS DECREASED

RATE OF OCCURRENCE OF BIT ERROR IN MEMORY CELL
WHEN VOLTAGE IS DECREASED AND DUMMY READ IS PERFORMED

BIT PATTERN OF MEMORY CELL
WHEN VOLTAGE IS DECREASED AND DUMMY READ IS PERFORMED (ALL OF INITIAL VALUES ARE SET TO 1 AND
VOLTAGE IS DECREASED TO 0.8 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 1 AND
VOLTAGE IS DECREASED TO 0.75 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 1 AND
VOLTAGE IS DECREASED TO 0.7 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 1 AND
VOLTAGE IS DECREASED TO 0.65 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 0 AND
VOLTAGE IS DECREASED TO 0.75 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 0 AND
VOLTAGE IS DECREASED TO 0.7 V FOR DUMMY READ)

BIT PATTERN OF MEMORY CELL
WHEN VOLTAGE IS DECREASED AND DUMMY READ IS PERFORMED (ALL OF INITIAL VALUES ARE SET TO 0 AND
VOLTAGE IS DECREASED TO 0.65 V FOR DUMMY READ)

SEMICONDUCTOR DEVICE FOR CALCULATING AN INTERACTION MODEL

CLAIM OF PRIORITY

The present application claims priority from Japanese application serial no. JP2014-176534, filed on Aug. 29, 2014, the content of which is hereby incorporated by reference into this application.

BACKGROUND

The present invention relates to a device that calculates an interaction model, and more specifically to a semiconductor device that determines the ground state of an Ising model.

Presently, the mainstream of computer architectures is of a Von Neumann type. In the Von Neumann architecture, the operation is defined by a program that is sequential instruction sequences. The Von Neumann architecture has versatility usable for various purposes by changing the program. A CPU (Central Processing Unit) that serves as a main role of a computer as well as an application-specific arithmetic and logic unit like a GPU (Graphics Processing Unit) are configured in the Von Neumann architecture, and the basic operation is the sequential execution of instruction sequences. Up to now, the improvement of the performance of computers mainly has depended on the improvement of clock frequencies. Since the fundamental of the Von Neumann architecture is the sequential execution of instruction sequences, it is expected to improve performance when the execution speed of instructions is increased. However, in general purpose CPUs for use in personal computers and servers, the improvement of clock frequencies reaches at best around three GHz achieved in early 2000s. In recent years, instead of clock frequencies of which further improvement is not expected, a mainstream strategy is to achieve the improvement of performance by parallel processing using multiple cores.

In parallel processing using multiple cores, the improvement of performance is aimed in which portions that can be executed in a parallel manner are found from sequential instruction sequences (extraction of parallelism) and the found instruction sequences are executed in a parallel manner. However, it is not easy to extract parallelism from a program in which a sequential algorithm is written in instruction sequences. ILP (Instruction Level Parallelism), which extracts parallelism at the level of instructions, has already reached a limit. In recent years, the tendency is that parallelism of coarser granularity such as TLP (Thread Level Parallelism) and DLP (Data Level Parallelism) is used.

In view of these situations, in order to improve the performance of computers in future, it is necessary to make a shift to substantially parallel information processing, not based on the execution of sequential instruction sequences as in previously existing manners. To this end, instead of a previously existing method for describing a problem in sequential instruction sequences, such a method for describing a problem is necessary, which is suited to implementing substantially parallel information processing.

One of the candidates is an Ising model. The Ising model is a model of statistical mechanics for explaining the behavior of magnetic substances, and used for the study of magnetic substances. The Ising model is defined as the interaction between nodes (a spin that takes two values of +1/−1). It is known that the determination of the ground state of an Ising model in which the topology is a nonplanar graph is an NP hard problem. Since the Ising model expresses a problem using an interaction coefficient spread in the spatial direction, it is possible to realize information processing using substantial parallelism.

Therefore, it is desirable to perform a search for the ground state of an Ising model using a solid state component like a semiconductor device in which a large number of elements to be constituents are regularly arrayed. More specifically, such a structure is desirable that the structure is an array structure represented by a storage device such as a DRAM and an SRAM and the structure has simple elements to be constituents in order to improve integration.

The Ising model is defined by a spin that takes two values, +1/−1 (or 0/1 or up/down), an interaction coefficient expressing an interaction between spins, and an external magnetic field coefficient provided for every spin. The Ising model can calculate energy at this time from a given spin array, interaction coefficients, and an external magnetic field coefficient. A search for the ground state of an Ising model means an optimization problem that finds an array of spins to minimize the energy function of the Ising model.

The Ising model can be interpreted as one form of interaction models that express various physical phenomena and social phenomena. The interaction model is a model defined by a plurality of nodes configuring the model and interactions between the nodes, and a bias for every node, as necessary. In physics and social science, various interaction models are proposed.

The characteristic of the interaction model is in that the influence between nodes is limited to an interaction between two nodes (an interaction between two bodies). For example, when the mechanics of planets in the universe space is considered, it can also be interpreted to be one kind of interaction models in that there is an interaction between nodes, which are planets, due to universal gravitation. However, the influence between planets includes the influence between two planets as well as the influence among three planets or more, and plants are affected to one another to exhibit complicated behaviors (which is a so-called three-body problem or many-body problem).

Moreover, in the world of biology, a neural network that models a brain is one example of interaction models. The neural network has an interaction called a synaptic connection between artificial neurons using artificial neurons that imitate neurons of nerve cells for nodes. Furthermore, a bias is sometimes applied to neurons. In the world of social science, when human communications are considered, for example, it can be easily understood that there are interactions formed of languages and communications between nodes as humans. In addition, it can also be imagined that humans individually have biases. Therefore, such a study is also made that human communications are imitated to a common Ising model and the like from the viewpoint of an interaction model to reveal the characteristics of human communications.

Since there are an enormous number of combinations of the states of spins that the spins included in an Ising model can take, it is substantially unfeasible to search all the combinations in order to determine a ground state. Thus, in order to efficiently find a ground state, it is necessary to narrow the combinations of spins to be searched. However, since harmful influence also arises in that combinations are narrowed to select a local optimal solution and only an approximate ground state is obtained, a scheme is necessary which can provide a better solution by avoiding a local solution found in the process of searching.

For this scheme, a scheme is proposed in which a ground state search is performed using quantum fluctuations with the use of a superconducting device. For example, for this device, there are devices described in International Publication No. WO/2012/118064 and Japanese Unexamined Patent Application Publication (Translation of PCT Application) No. 2011-524026.

Moreover, Japanese Unexamined Patent Application Publication No. 2014-99225 describes that it is possible that in the case where an SRAM memory cell MC is defective, a leakage current is generated in a low standby mode, and data in the memory cell MC is destructed. A semiconductor device is provided, which includes a low-standby test mode in order to inspect the data holding characteristics of a memory cell MC in a low standby mode, in which in the final process step of a semiconductor chip fabrication process, a bit line potential is fixed to an "L" level, and an accelerated test is performed for data destruction to identify a defective memory cell.

SUMMARY

In the method for escaping a local solution in a form of quantum fluctuations using a superconducting device described in International Publication No. WO/2012/118064 and Japanese Unexamined Patent Application Publication (Translation of PCT Application) No. 2011-524026, since hardware that implements a superconducting state is formed, it is necessary to use an advanced cooling device. Thus, problems arise in that the entire apparatus is highly expensive and it is difficult to upsize the apparatus.

In Japanese Unexamined Patent Application Publication No. 2014-99225, a unit is adopted that fixes the potential of a bit line to the "L" level in order to reveal a defective SRAM memory cell in the test stage before shipping products. It is an object of the present invention to implement a ground state search process in which in the process of using a normal memory cell for the arithmetic operation of the process of searching for the ground state of an Ising model, a desired range of bit error occurrence probability is controlled to cause random bit errors on the memory cell and a global optimal solution is aimed while escaping from a local optimal solution.

The present invention is made in consideration of the problem. It is an object to provide a semiconductor device that is easily upsized at low costs and performs a search for the ground state of an Ising model in which a memory cell power supply voltage can be variably controlled and an address decoder, a word, and a bit driver are modified in a small scale to supply randomness to states of spins included in the Ising model.

In the present invention to solve the problem, a semiconductor device is one including a memory cell array in which a plurality of memory cells are disposed in a matrix configuration; a word line provided in correspondence with rows of the memory cells; a bit line pair provided in correspondence with columns of the memory cells; and a word decoder configured to activate the word line. The word lines are activated and the bit line pair is fixed to a voltage at the same level.

Moreover, in the present invention to solve the problem, the semiconductor device further includes a multiword decoder configured to multiplex a word address according to an input of a multiplicity specify signal to a word line and simultaneously activate a plurality of word lines; and a bit line driver configured to simultaneously subject a plurality of memory cells, of the memory cells connected to bit line pairs and arrayed in a column direction, activated by the plurality of the word lines to a write operation or a read operation.

Furthermore, in the present invention to solve the problem, in the semiconductor device, a configuration is further included in which a power supply voltage supplied to the memory cell is supplied as a voltage to be decreased below a predetermined voltage to be variably changed; and in a state in which the power supply voltage supplied to the memory cell is decreased below a predetermined voltage, the multiword decoder simultaneously activates a plurality of the word lines to perform a read operation. Thus, a bit error is induced on the memory data of the memory cell.

In addition, in the present invention to solve the problem, in the semiconductor device, according to the inputted multiplicity specify signal, the multiword decoder generates a variation of a last digit of an address to a reference word address, and simultaneously activates a plurality of word lines.

Moreover, in the present invention to solve the problem, in the semiconductor device, the bit line driver further includes a function in which a precharge voltage is connected to the bit line pair and the bit line pair is fixed to an "H" level; a configuration is further included in which a power supply voltage supplied to the memory cell is supplied as a voltage to be decreased below a predetermined voltage to be variably changed; and in a state in which the power supply voltage supplied to the memory cell is decreased below a predetermined voltage, the precharge voltage is connected to the bit line pair, the bit line pair is fixed to an "H" level, and the word lines are activated using the word decoder. Thus, a bit error is induced on the memory data of the memory cell.

According to the present invention, in the semiconductor device that performs a search for the ground state of an Ising model, the multiword decoder is used to select a plurality of word lines at the same time, and it is possible to implement writing the same value between words or to implement the destruction of memory data of the memory cell of words.

Moreover, it is possible to provide a semiconductor device that is easily upsized at low costs and performs a search for the ground state of an Ising model in which a memory cell power supply voltage can be variably controlled and an address decoder, a word, and a bit driver are modified in a small scale to supply randomness to states of spins included in the Ising model.

BRIEF DESCRIPTION OF THE DRAWINGS

FIG. 11 is a diagram of the relationship among grouping of the spin units, an interactive clock, and an interactive address;

FIG. 29A is the ratio (the vertical axis) of the values of all the memory cells in which the initial values of all the memory cells are turned to zero, the supply voltage is decreased to the voltage on the horizontal axis of a graph, and then the memory cells are read at a normal voltage (a rated voltage of 1 V), and FIG. 29B is the ratio (the vertical axis) of the values of all the memory cells in which the initial values of all the memory cells are turned to one, the supply voltage is decreased to the voltage on the horizontal axis of a graph, and then the memory cells are read at a normal voltage;

FIG. 30A is the ratio (the vertical axis) of the values of all the memory cells in which the initial values of all the memory cells are turned to zero, the supply voltage is decreased to the voltage on the horizontal axis of a graph, dummy read is performed, and then the memory cells are read at a normal voltage, and FIG. 30B is the ratio (the vertical axis) of the values of all the memory cells in which the initial values of all the memory cells are turned to one, the supply voltage is decreased to the voltage on the horizontal axis of a graph, dummy read is performed, and then the memory cells are read at a normal voltage;

DETAILED DESCRIPTION

In the following, embodiments will be described with reference to the drawings.

First Embodiment

In this embodiment, examples of an Ising chip 100, which is a semiconductor device that determines the ground state of an Ising model and an information processor 200 that controls the Ising chip 100 will be described.

(1) Transform a Problem to be Solved to a Problem of Searching for the Ground State of an Ising Model An Ising model is a model of statistical mechanics for explaining the behavior of magnetic substances. The Ising model is defined by a spin that takes two values, +1/−1 (or 0/1 or up/down), an interaction coefficient expressing an interaction between spins, and an external magnetic field coefficient provided for every spin.

The Ising model can calculate energy at this time from a given spin array, an interaction coefficient, and an external magnetic field coefficient. Energy function E(σ) of the Ising model is generally expressed by the following expression (Expression 1). It is noted that suppose that $\sigma_i$ and $\sigma_j$ express the values of the ith spin and the jth spin, $J_{i,j}$ expresses an interaction coefficient between the ith spin and the jth spin, $h_i$ expresses an external magnetic field coefficient to the ith spin, <i, j> express a combination of two adjacent sites, and σ expresses an array of spins.

[Expression 1]

$$E(\sigma) = -\sum_{\langle i,j \rangle} J_{i,j}\sigma_i\sigma_j - \sum_i h_i\sigma_i \quad \text{(Expression 1)}$$

To determine the ground state of the Ising model means an optimization problem that finds an array of spins to minimize the energy function of the Ising model.

For example, optimization problems that seemingly have no relationship with magnetic substances such as a maximum cut problem can be transformed into a problem of searching for the ground state of the Ising model. The ground state of the Ising model, which is transformed and obtained, corresponds to a solution of the original problem. Thus, it can be said that a device that can search for the ground state of an Ising model is a computer usable for general purposes.

In the present embodiment, the description is made as a search for the ground state of an Ising model is taken for an example. However, it goes without saying that a search for the ground state of an Ising model can be similarly applied as the Ising model is replaced by a ground state search for an interaction model described above.

(2) The Configuration of the Ising Chip

Figure 1:
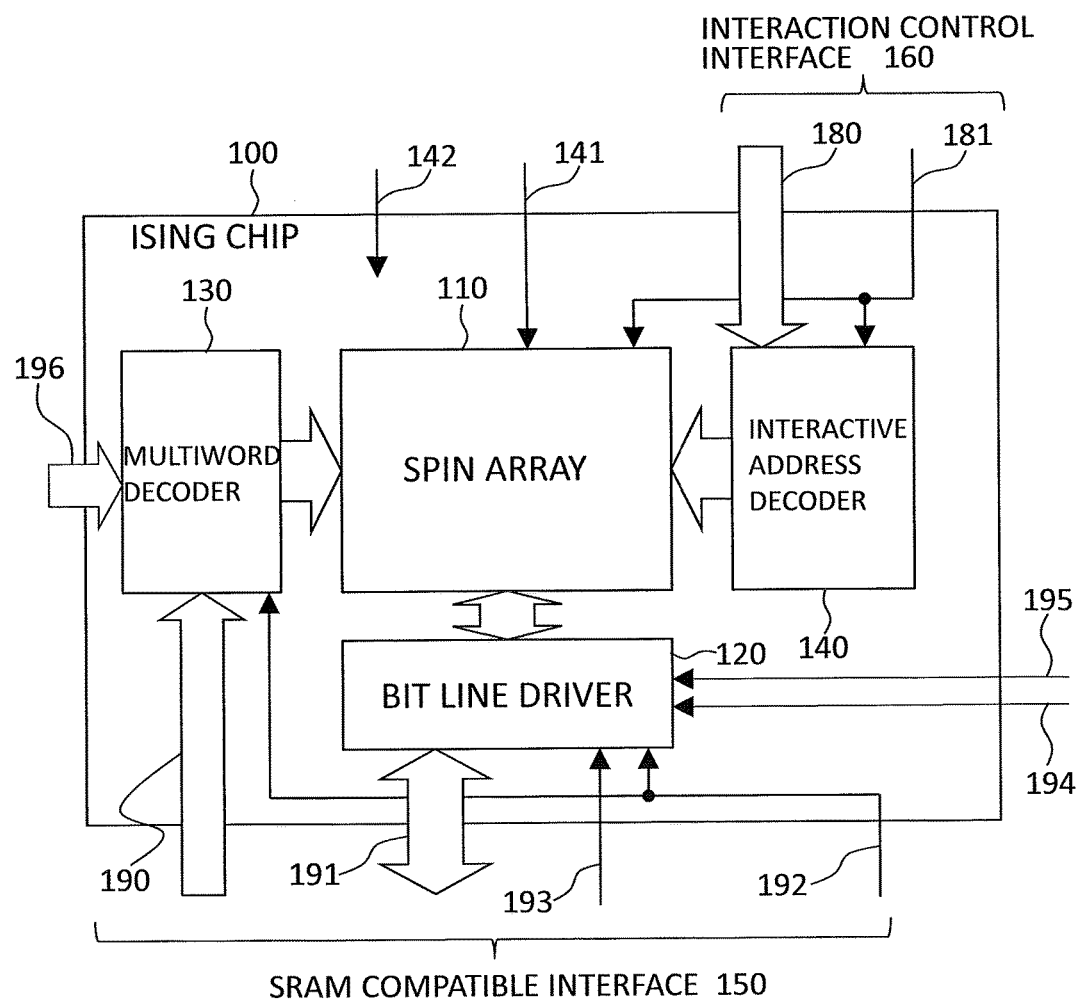
FIG. 1 is a diagram of an exemplary configuration of an Ising chip, which is a semiconductor device according to the present invention.

FIG. 1 is a block diagram of an example of the Ising chip 100 according to the present embodiment. The Ising chip 100 is formed of a spin array 110, a bit line driver 120, a multiword decoder 130, and an interactive address decoder 140. In the present embodiment, the description is made in the assumption that the Ising chip 100 is mounted as a CMOS integrated circuit presently widely used, and the Ising chip 100 can also be implemented using other solid state components.

As described later in FIGS. 3 and 4, the spin array 110 includes one spin and an interaction coefficient associated with the spin and a spin unit 300 that holds an external magnetic field coefficient and implements a ground state search process as a unit of basic components, and the spin array 110 is configured in which a large number of the spin units 300 are arrayed. The spin array 110 has two functions, the function of an SRAM and the function of an interaction circuit that performs a search for the ground state of an Ising model.

The bit line driver 120 and the multiword decoder 130 are interfaces when the spin array 110 is used as an SRAM. The bit line driver 120 sends and receives a bit string to read from or write to the spin array 110 through a data bus 191, and can switch between the read operation and the write operation according to a signal from a R/W control line 193. Moreover, for a characteristic function according to the present embodiment, a selection line 194 and a bit destruction line 195 are included to perform control in which the spin of the spin unit 300 at a specified address in the spin array 110 is destructed at a certain probability.

The multiword decoder 130 maps addresses through an address bus 190. The multiword decoder 130 generates a row select signal and a column select signal according to an address signal from the address bus 190, drives a corresponding word line according to the row select signal, and supplies the column select signal to the bit line driver 120. Moreover, for a characteristic function according to the present embodiment, a multiplicity control line 196 is externally included in order to control a plurality of word lines to be activated at the same time.

Both of the bit line driver 120 and the multiword decoder 130 are operated in synchronization with an I/O clock 192.

The Ising chip 100 has a SRAM compatible interface 150 that reads data from or writes data to the spin array 110, which is the address bus 190, the data bus 191, the R/W control line 193, and the I/O clock 192. Furthermore, for an interaction control interface 160 that controls a search for the ground state of an Ising model, an interactive address 180 and an interactive clock 181 are included.

The Ising chip 100 is operated at a voltage supplied through a normal power supply line 142. However, a part of the spin array 110 is operated at a voltage supplied through a memory cell power supply line 141. More specifically, the memory cell included in the spin unit 300 (FIG. 3) configuring the spin array 110 is operated at a voltage supplied through the memory cell power supply line 141 that can variably control the voltage.

In the Ising chip 100, the spin $\sigma_i$ of the Ising model, the interaction coefficients $J_{i,j}$, and the external magnetic field coefficient $h_i$ are all expressed by information stored in memory cells in the spin array 110. In order to set the initial state of the spin and read a solution after the completion of the ground state search, the SRAM compatible interface 150 reads or writes the spin $\sigma_i$. Furthermore, in order to set an Ising model whose ground state is to be searched to the Ising chip 100, the SRAM compatible interface 150 also reads or writes the interaction coefficients $J_{i,j}$ and the external magnetic field coefficient $h_i$. Therefore, addresses are allocated to the spin $\sigma_i$, the interaction coefficients $J_{i,j}$, and the external magnetic field coefficient $h_i$ in the spin array 110. It is noted that the address bus 190, the data bus 191, and the R/W control line 193 configuring the SRAM compatible interface 150 are operated in synchronization with clocks inputted to the I/O clock 192. However, in the present invention, it is unnecessary that the interface is a synchronous interface, which may be an asynchronous interface. In the present embodiment, the description will be made on the premise that they are synchronous interfaces.

In addition, in order to perform a ground state search, the Ising chip 100 implements an interaction between spins in the inside of the spin array 110. It is the interaction control interface 160 that externally controls the interaction. More specifically, the interactive address 180 inputs the address to specify a spin group for interactions, and the interactive address decoder 140 performs interactions in synchronization with clocks inputted to the interactive clock 181 in order to use the spin array 110 for the interaction circuit. The detail of the interaction operation will be described later.

It is noted that interactions are not necessarily implemented in a clock synchronous circuit, which may be a clock asynchronous circuit. In this case, the role of the interactive clock 181 is not to receive clocks but to receive an enable signal that permits the execution of an interaction. The interaction control interface is not necessarily a synchronous interface as well, which may be an asynchronous interface. However, the description is made on the premise that in the present embodiment a synchronous interface is used and an interaction is performed in synchronization with the interactive clock 181.

(3) The Configuration of the Information Processor

Figure 2:
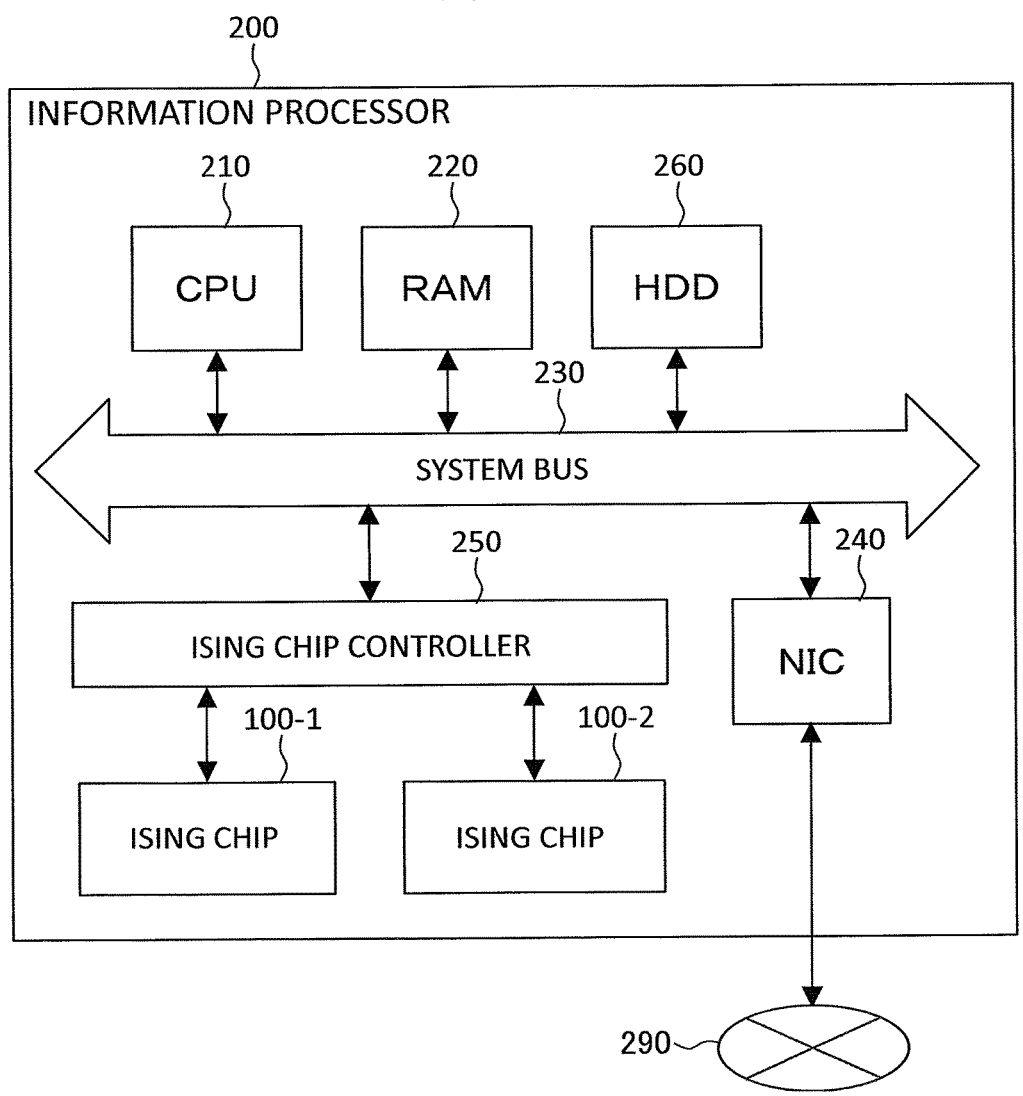
FIG. 2 is a diagram of an exemplary configuration of an information processor that controls the Ising chip, which is semiconductor device according to the present invention.

The information processor is to be implemented using one or a plurality of the Ising chips 100. To this end, it is necessary to control the interfaces described above. Thus, the Ising chip 100 is used as a part of the information processor 200 as illustrated in FIG. 2.

It can be thought that the information processor 200 is one that an accelerator configured of the Ising chip 100 is mounted on a device like a personal computer or a server presently generally used. The information processor 200 includes a CPU 210, a RAM 220, a HDD 260, and a NIC 240, which are connected through a system bus 230. This is a configuration generally observed in present personal computers and servers. In addition to this, an Ising chip controller 250 is connected to the system bus 230, and a single Ising chip or a plurality of Ising chips are included in the subsequent stage. In the example in FIG. 2, two Ising chips 100-1 and 100-2 are included. In the following, two Ising chips are simply referred to as the Ising chip 100 when it is unnecessary to distinguish between two Ising chips more specifically. The Ising chip controller 250 and the Ising chip 100 correspond to an accelerator, and a form like an expansion card is formed which is inserted into a peripheral expansion interface like PCI Express, for example. The Ising chip controller 250 is one that converts the protocols of the system bus 230 (PCI Express and QPI, for example) as matched with the interfaces of the Ising chip. Software operated on the CPU 210 of the information processor 200 can control the Ising chip 100 through the Ising chip controller 250 generally by reading data from or writing data to a certain address (a so-called Memory Mapped I/O (MMIO)). Moreover, it may be fine that a plurality of information processors like this are connected through an inter-device network 290 for use.

(4) The Configuration of the Spin Array

Figure 5:
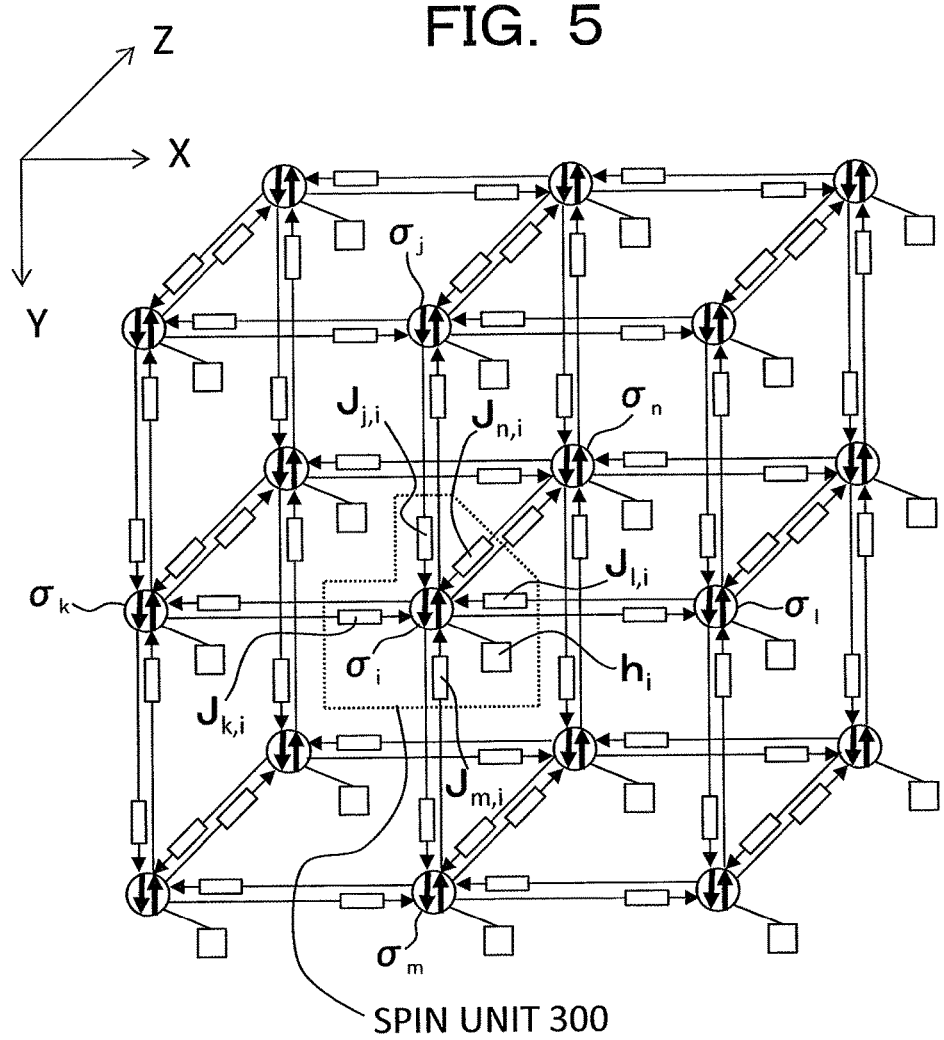
FIG. 5 is a diagram of an exemplary configuration of a spin array in a three-dimensional lattice.

The spin array 110 is configured of a spin unit 300 that holds one spin and an interaction coefficient and an external magnetic field coefficient associated with the spin and implements a ground state search process, which is a unit of basic components, in which a large number of the spin units 300 are arrayed. FIG. 5 is an example that a plurality of the spin units 300 are arrayed to configure an Ising model having a three-dimensional lattice topology. The example illustrated in FIG. 5 is a three-dimensional lattice in the size of three (in an X-axis direction) by three (in a Y-axis direction) by two (in a Z-axis direction). As illustrated in the drawing, the definition of coordinate axes is that the right direction in the drawing is the X-axis, the downward direction in the drawing is the Y-axis, and the depth direction in the drawing is the Z-axis. The coordinate axes are necessary only for convenience of the description in the present embodiment, and have no relationship with the disclosure. In the case where a topology other than the three-dimensional lattice, a tree topology, for example, is used, the number of stages of trees is used for description. In the three-dimensional lattice topology in FIG. 5, when the interaction between spins is thought as a graph, spins (vertexes) of the order five are necessary at the maximum. It is noted that in consideration of the connection to the external magnetic field coefficient as well, the order six is necessary at the maximum.

To a single spin unit 300 illustrated in FIG. 5, the values of adjacent spins, $\sigma_j$, $\sigma_k$, $\sigma_l$, $\sigma_m$, and $\sigma_n$ are inputted (for example, in the case where adjacent spins are five spins). Moreover, the spin unit 300 includes memory cells that hold interaction coefficients $J_{j,i}$, $j_{k,i}$, $j_{l,i}$, $j_{m,i}$ and $J_{n,i}$ to the adjacent spins (interaction coefficients with five adjacent spins) in addition to the spin $\sigma_i$ and the external magnetic field coefficient $h_i$.

Meanwhile, the Ising model generally has interactions expressed by an undirected graph. In Expression 1, terms expressing an interaction are $J_{i,j} \times \sigma_i \times \sigma_j$, which shows an interaction from the ith spin to the jth spin. At this time, in a typical Ising model, the interaction from the ith spin to the jth spin is not distinguished from the interaction from the jth spin to the ith spin. In other words, $J_{i,j}$ and $J_{j,i}$ are the same. However, in the Ising chip 100 according to the present invention, it is implemented that the Ising model is expanded into a directed graph, and the interaction from the ith spin to the jth spin and the interaction from the jth spin to the ith spin are in asymmetry. Thus, it is possible that the expressivity of the model is enhanced and many problems are expressed by a model in a smaller scale.

Therefore, when a single spin unit 300 is considered to be the ith spin $\sigma_i$, the interaction coefficients $J_{j,i}$, $j_{k,i}$, $j_{l,i}$, $j_{m,i}$, and $j_{n,i}$ held by this spin unit determine interactions from the adjacent jth spin $\sigma_j$, the kth spin $\sigma_k$, the lth spin $\sigma_l$, mth spin $\sigma_m$, the nth spin $\sigma_n$ to the ith spin $\sigma_i$. This corresponds to that in FIG. 5, arrows (interactions) corresponding to the interaction coefficients included in the spin unit 300 are directed from spins in the outside of the spin unit 300 to the spin in the inside of the spin unit 300.

(5) The Configuration of the Spin Unit

An exemplary configuration of the spin unit 300 will be described with reference to FIGS. 3 and 4. The spin unit 300 has two aspects. For convenience, the aspects will be described separately in FIGS. 3 and 4, and a single spin unit 300 includes both configurations in FIGS. 3 and 4. FIG. 3 is a circuit that implements the interaction between spin units, and FIG. 4 is a circuit that attention is focused on word lines and bit lines, which are interfaces to make access to the memory cells included in the spin unit from the outside of the Ising chip 100. It is noted that how to connect interfaces EN, NU, NL, NR, ND, NF, and N illustrated in the circuit that implements the interaction in FIG. 3 among a plurality of the spin units will be described later with reference to FIGS. 9 and 11. Moreover, how to connect the word lines to the bit lines in FIG. 4 among a plurality of spin units will be described later with reference to FIG. 8.

In order to hold the spin $\sigma_i$, the interaction coefficients $J_{j,i}, \ldots J_{n,i}$ and the external magnetic field coefficient $h_i$ of the Ising model, the spin unit 300 includes a plurality of one-bit memory cells. The one-bit memory cells are illustrated in FIGS. 3 and 4 as N, IS0, IS1, IU0, IU1, IL0, IL1, IR0, IR1, ID0, ID1, IF0, and IF. It is noted that since IS0 and IS1, IU0 and IU1, IL0 and IL1, IR0 and IR1, ID0 and ID1, and IF0 and IF1 serve in a pair, they are collectively abbreviated to ISx, IUx, ILx, IRx, IDx, and IFx.

Figure 10A:
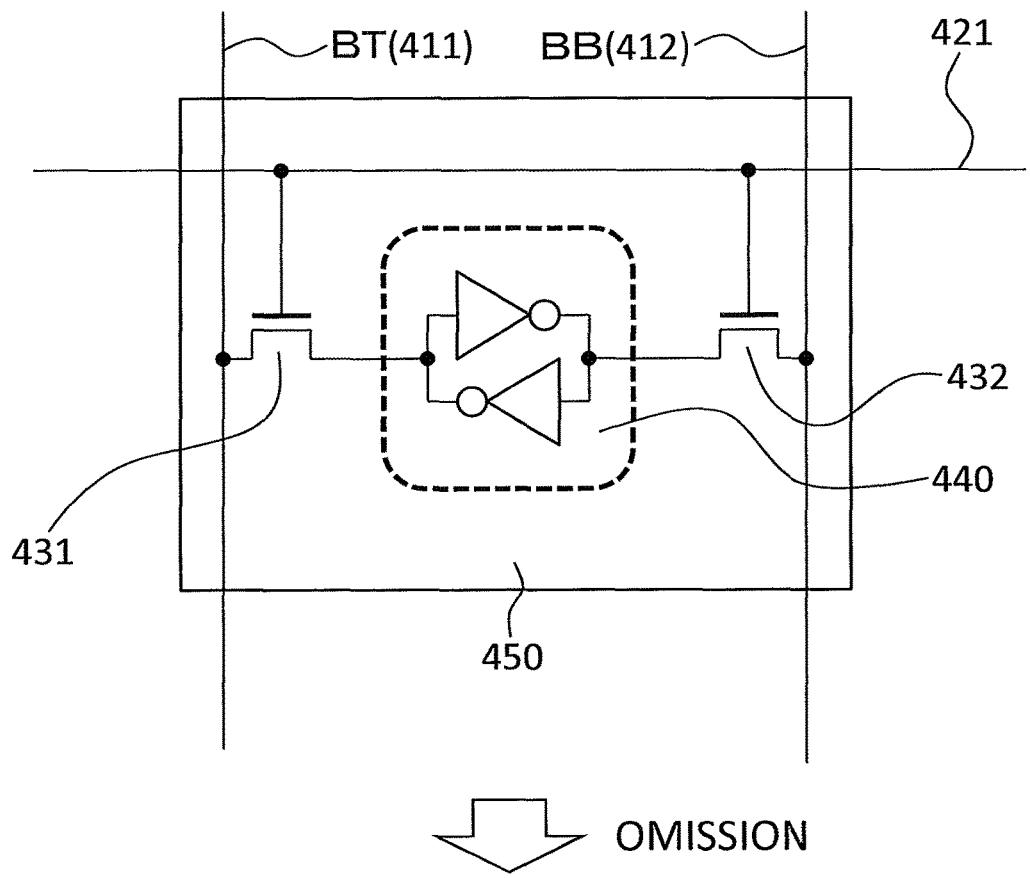
FIGS. 10A and 10B are diagrams of illustrative of an exemplary configuration of a memory cell.
Figure 10B:
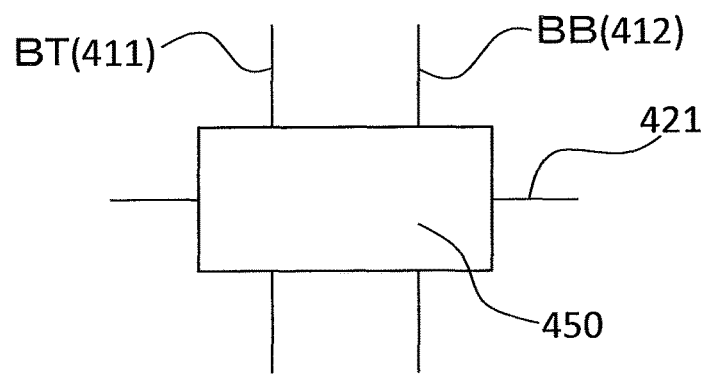

An exemplary structure of the memory cells included in the spin unit 300 is illustrated in FIGS. 10A and 10B. FIGS. 10A and 10B are diagrams of an exemplary structure of a memory cell 450. The memory cell 450 includes a data holding unit 440 formed of two CMOS inverters, and implements data read from and data write to the data holding unit 440 by controlling pass gate transistors 431 and 432 using a word line 421 and bit lines 411 and 412.

Here, the description will be made with the spin unit 300 expressing the ith spin. The memory cell N is a memory cell that expresses the spin $\sigma_i$ and holds the value of the spin. The value of the spin is +1 or −1 in the Ising model (+1 is also expressed as up and −1 is also expressed as down), and the value corresponds to two values of the memory cell, 0 and 1. For example, +1 corresponds to 1, and −1 corresponds to 0.

Figure 6:
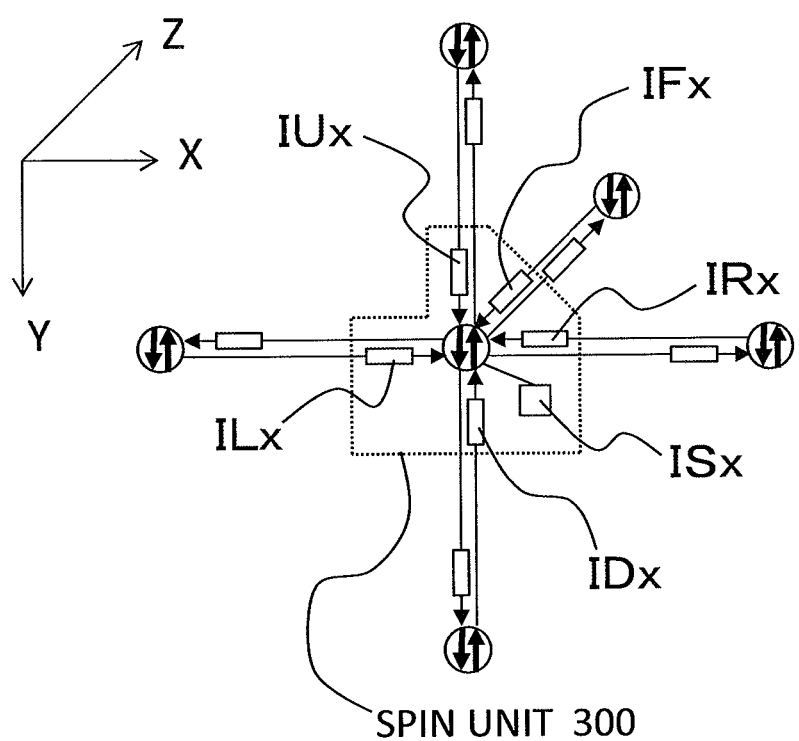
FIG. 6 is a diagram of the corresponding relationship between a memory cell and the topology of a spin array in the spin unit.

FIG. 6 is the corresponding relationship between the memory cells included in the spin unit 300 and the topology of the Ising model illustrated in FIG. 5. ISx expresses an external magnetic field coefficient. Moreover, IUx, ILx, IRx, IDx, and IFx express interaction coefficients. IUx is the interaction coefficient with the spin on the upper side (−1 in the Y-axis direction), ILx is the interaction coefficient with the spin on the left side (−1 in the X-axis direction), IRx is the interaction coefficient with the spin on the right side (+1 in the X-axis direction), IDx is the interaction coefficient with the spin on the lower side (+1 in the Y-axis direction), and IFx is the interaction coefficient with the spin connected in the depth direction (+1 or −1 in the Z-axis direction). Moreover, in the case where the Ising model is thought as a directed graph, a certain spin observes the other spins that have coefficients of influence exerted on the certain spin. The coefficient of influence exerted on the other spins by the certain spin belongs to the other spins. In other words, this spin unit 300 is connected to five spins at the maximum. In the Ising chip 100 according to the present embodiment, the coefficients correspond to three values of +1, 0, and −1 for the external magnetic field coefficient and the interaction coefficients. Therefore, in order to express the external magnetic field coefficient and the interaction coefficients, two-bit memory cells are necessary. ISx, IUx, ILx, IRx, IDx, and IFx express three values of +1, 0, and −1, in the combination of two memory cells having the tail numerical characters of 0 and 1 (for example, in the case of ISx, a combination of IS0 and IS1). For example, in the case of ISx, IS1 expresses +1/−1. When IS1 is 1, IS1 expresses +1, and when IS1 is 0, IS1 expresses −1. In addition to this, when IS0 is 0, the external magnetic field coefficient is considered to be zero, and when IS0 is one, any one value +1 or −1 determined by IS1 is the external magnetic field coefficient. When it is thought that IS0 disables the external magnetic field coefficient when the external magnetic field coefficient is zero, it can be said that IS0 is the enable bit of the external magnetic field coefficient (the external magnetic field coefficient is enabled when IS0=1). The coefficients IUx, ILx, IRx, IDx, and IFx that express interaction coefficients are similarly matched with the bit values.

It is necessary that the memory cells N, IS0, IS1, IU0, IU1, IL0, IL1, IR0, IR1, ID0, ID1, IF0, and IF1 in the spin unit 300 can be externally read or written from the outside of the Ising chip 100. To this end, as illustrated in FIG. 4, the spin unit 300 includes bit lines 410 and word lines 420. The spin units 300 are arrayed in tiles on a semiconductor substrate to connect the bit lines 410 to the word lines 420, and are driven, controlled, written, and read using the multiword decoder 130 and the bit line driver 120, so that the memory cells in the spin unit 300 can be read and written through the SRAM compatible interface 150 of the Ising chip 100 similarly to a typical SRAM (Static Random Access Memory).

(6) The Disposition of the Spin Units in the Spin Array

Figure 7:
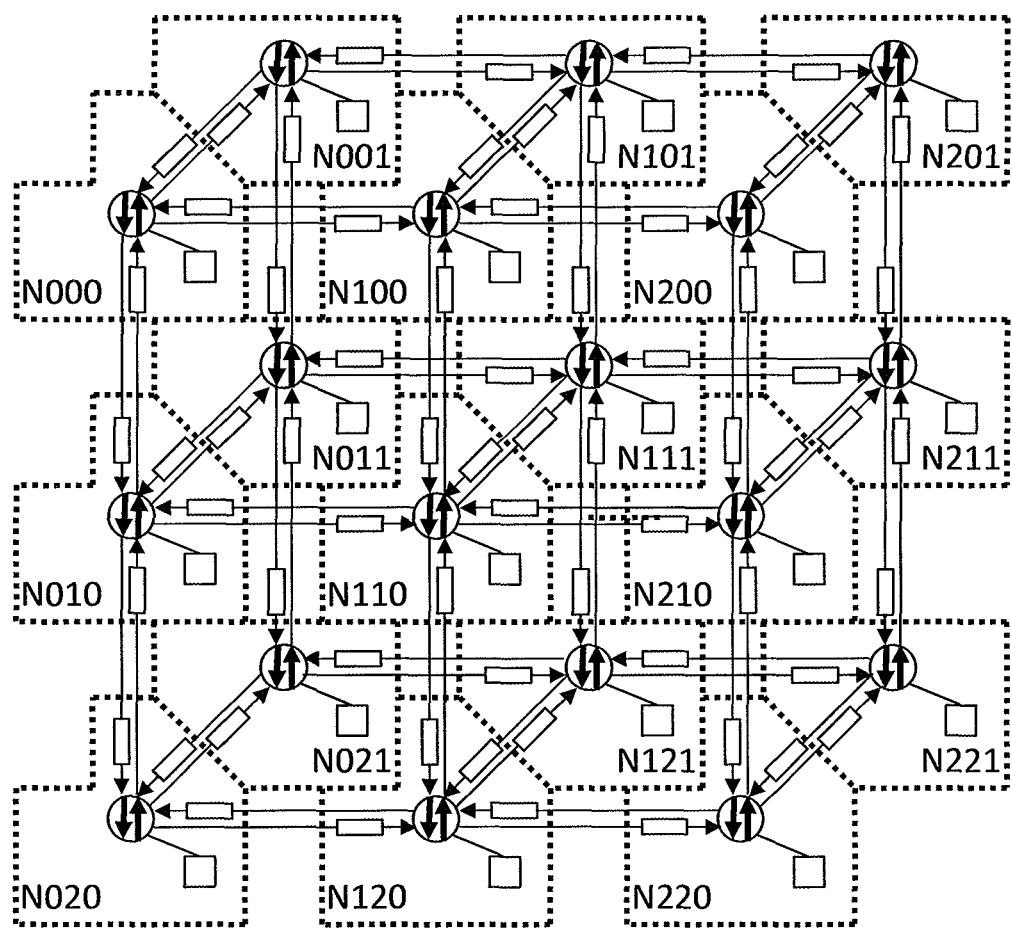
FIG. 7 is a diagram of an exemplary corresponding relationship between the spin array in a three-dimensional lattice and the spin unit.
Figure 8:
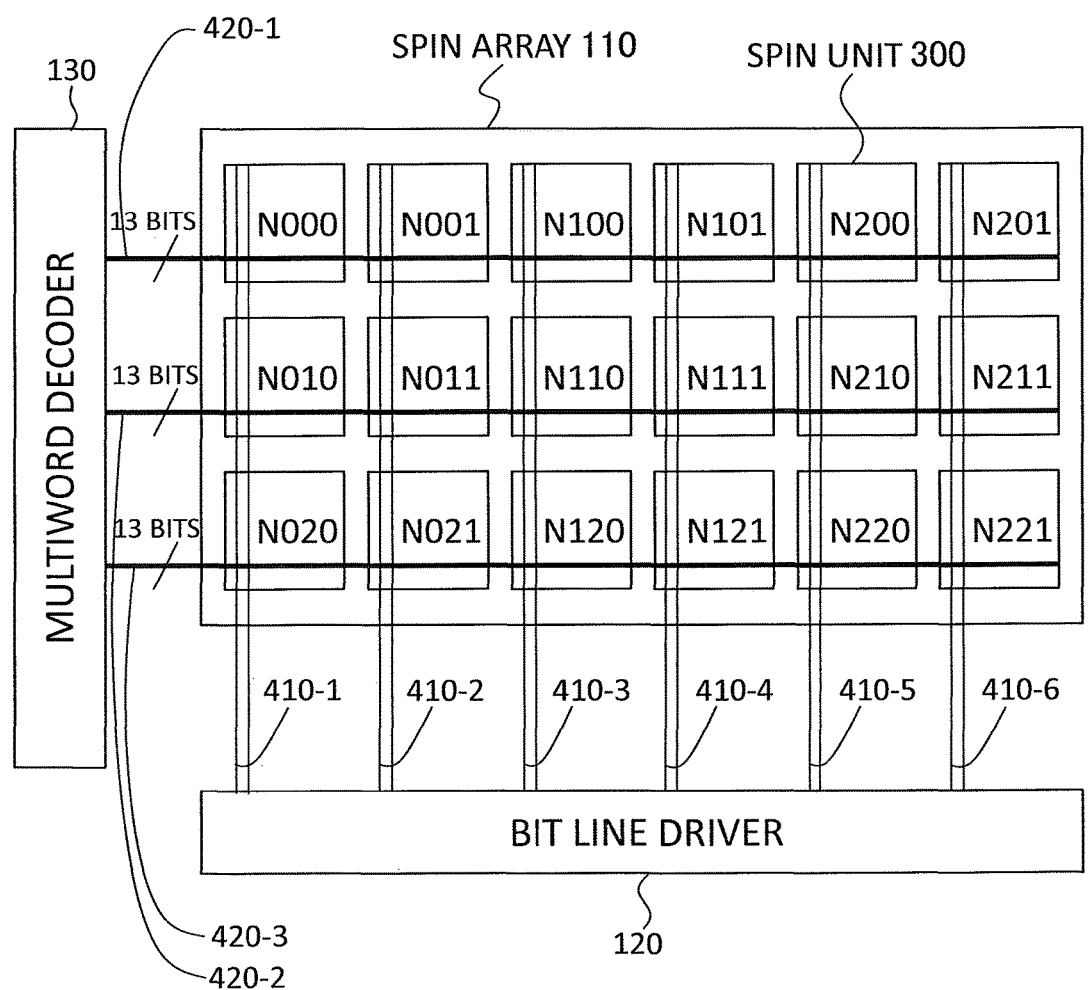
FIG. 8 is a diagram of an exemplary disposition of spin units on the Ising chip.

The configuration of the spin array 110 will be described with reference to FIG. 8 from the viewpoint of the layout of a semiconductor device. Since the spin array 110 according to the present embodiment has a three-dimensional lattice topology as illustrated in FIG. 5, in order to implement the spin array 110 as a semiconductor device forming a circuit on a two-dimensional plane, some schemes are necessary for the layout. Therefore, a disposition as illustrated in FIG. 8 is provided. It is noted that FIG. 7 is a diagram that which vertexes correspond to the spin unit 300 expressed in FIG. 8 (signs are assigned on positions on the X-axis, the Y-axis, on the Z-axis as Nxyz) on a three-dimensional lattice topology. In order to dispose the vertexes of a three-by-three-by-two three-dimensional lattice on a two-dimensional plane, the vertexes are disposed in such a manner that the lattice vertexes of the lattice vertex array in the Z-axis direction are inserted into the gaps in the lattice vertex array in the X-axis direction. In other words, in the Y-axis direction (the lower side of the drawing is the Y-axis in the positive direction) on the two-dimensional plane in FIG. 8, vertexes Nx0z, Nx1z, and Nx2z are disposed, and in the X-axis direction (the right side of the drawing is the positive direction of the X-axis), spin units having the Z-axis direction coordinate 0 or 1 are alternately disposed as N0y0, N0y1, N1y0, N1y1, N2y0, and N2y1.

Physically, the spin units 300 are disposed on the Ising chip 100 as illustrated in FIG. 8, and word lines 420-1, 420-2, and 420-3 are connected to bit lines 410-1, 410-2, 410-3, 410-4, 410-5, and 410-6 as illustrated in FIG. 8. These word lines and bit line are connected to the word lines 420 and the bit lines 410 of the spin unit 300 illustrated in FIG. 4. Since the spin units 300 include 13 memory cells in the array direction of the word lines (the word line 420 has 13 bits), word lines 420-1, 420-2, and 420-3 individually have 13 bits.

(7) The Control of the Ground State Search Process for the Ising Model

In order to implement a search for the ground state of the Ising model, it is necessary to implement the interaction between spins in such a manner that the energy of the entire Ising model is transitioned to a lower spin array. The interaction for this purpose is performed based on a given interaction coefficient and a given external magnetic field coefficient. In other words, the subsequent value of a certain spin is determined from interactions from the other spins connected to the certain spin and the external magnetic field coefficient of the certain spin. At this time, the subsequent value of the certain spin is a value that minimizes local energy in a region in which the certain spin is connected.

To update the certain spin, it can be first thought that the spins are sequentially updated one by one. However, in this method, time is required proportional to the number of spins, and it is not enabled to use parallelism. Therefore, it is desirable to concurrently perform interactions among all the spins.

However, in the case where all the spins are updated at the same time, in the update of a certain spin, the certain spin is updated in such a manner that the value of the adjacent spin is referenced and energy is minimized between the certain spin and the adjacent spin. Therefore, when the value of the adjacent spin is updated at the same, two updates are overlapped with each other, energy is not enabled to be minimized, and vibrations occur. In other words, when a certain spin is updated, it is not enabled to update spins connected to the certain spin at the same time (in the following, the spins directly connected to the certain spin through interaction coefficients are referred to as adjacent spins).

Therefore, in the present invention, in order not to update adjacent spins at the same time, the spin units 300 in the spin array 110 are grouped, and only one group is updated at the same time. It may be fine that in the topology as illustrated in FIG. 5, the spin units 300 are divided into two groups. The two groups are alternately updated. In order to specify a group to be updated at some timing, the Ising chip 100 uses the interactive address 180 as an input interface. The interactive address 180 is an interface that specifies a group to be updated in the groups described above, and the spins (the spin units 300) belonging to the group specified by the interactive address 180 are updated at the same time by the input of the interactive clock 181.

It may be fine that when this method is used, it is unnecessary to provide additional hardware in the spin unit 300 and only a pair of the interactive address decoders 140 is provided in the entire Ising chip 100. Therefore, the problems above can be solved without complicating the spin unit 300, which is a constituent.

The grouping will be described with reference to FIG. 11. In FIG. 11, the spin units Nxyz are divided into two groups, group A and group B. As described later, the spin units 300 include an interface (EN) that inputs a signal to permit the update of spins. Therefore, an address specified by the interactive address b 180 (the identifier of a group) is decoded by the interactive address decoder 140, and update permission signals for individual groups are generated. In the example in FIG. 11, a group A specification signal 143 and a group B specification signal 144 are update permission signals for individual groups. The spin units belonging to a group that an update is permitted at this time is then updated by the interactive clock 181. It is noted that the adjacent spins always belong to different groups in the topology in FIG. 5 because of grouping illustrated in FIG. 11.

Moreover, it may be fine that the spin units 300 are divided into smaller groups because of power consumption in addition to the avoidance of collision when updated at the same time as described above. For example, in the example described above, the collision when updated can be avoided if the spin units 300 are divided into two groups. However, in the case where power consumption becomes a problem when all the spins are updated at the same time, it may be fine that a single group is divided into smaller groups, for instance. For example, when the spin units 300 are divided into two groups, a single group is split into four groups because of power consumption, and the spin units 300 are divided into eight groups in total.

(8) The Circuit Configuration That Determines the Subsequent State of the Spin Included in the Spin Unit The spin unit 300 includes a circuit that calculates an interaction and determines the subsequent state of the spin in order to update spin units at the same time separately for the individual spin units. A circuit that determines the subsequent state of the spin is illustrated in FIG. 3. In FIG. 3, the spin unit includes the interfaces EN, NU, NL, NR, ND, NF, and N to the outside. EN is an interface that inputs a signal to permit the update of spins of the spin unit. N is an interface that outputs the value of the spin of the spin unit to the other spin units (the adjacent units in the topology in FIG. 5). NU, NL, NR, ND, and NF are interfaces that inputs the values of the spins included in the other spin units (the adjacent units in the topology in FIG. 5). NU is an input from the spin on the upper side (−1 in the Y-axis direction), NL is an input from the spin on the left side (−1 in the X-axis direction), NR is an input from the spin on the right side (+1 in the X-axis direction), ND is an input from the spin on the lower side (+1 in the Y-axis direction), and NF is an input from the spin connected in the depth direction (+1 or −1 in the Z-axis direction). It is noted that when the topology of the Ising model is considered, it is necessary to determine a process at the end. When the end is simply terminated as in the topology in FIG. 5, it may be fine that one for the end inputs nothing in NU, NL, NR, ND, and NF (on the circuit, an appropriate process is performed as an unused input terminal; it is connected to a fixed value 0 or 1, for example). For example, in the case of the spin unit N000, two terminals NU and NL have no input.

In the spin unit 300, the subsequent state of the spin is determined in such a manner that energy is minimized between the spin and the adjacent spin. This is equivalent to the determination which one of the positive value and the negative value is dominant when the product of the adjacent spin and the interaction coefficient and the external magnetic field coefficient are considered. For example, the subsequent state of the spin $\sigma_i$ is determined as follows, where the spins $\sigma_j$, $\sigma_k$, $\sigma_l$, $\sigma_m$, and $\sigma_n$ are adjacent to the ith spin $\sigma_i$. First, suppose that the values of the adjacent spins are $\sigma_j=+1$, $\sigma_k=-1$, $\sigma_l=+1$, $\sigma_m=-1$, and $\sigma_n=+1$, the interaction coefficients are $J_{j,i}=+1$, $j_{k,i}=+1$, $j_{l,i}=+1$, $j_{m,i}=-1$, and $J_{n,i}=-1$, and the external magnetic field coefficient is $h_i=+1$. At this time, when the products of the interaction coefficients and the adjacent spins and the external magnetic field coefficient are arranged, the following is obtained: $\sigma_j \times J_{j,i}=+1$, $\sigma_k \times j_{k,i}=-1$, $\sigma_l \times j_{l,i}=+1$, $\sigma_m \times j_{n,i}=+1$, $\sigma_n \times J_{n,i}=-1$, and $h_i=+1$. It may be fine that it can be read differently that the external magnetic field coefficient is an interaction coefficient with a spin whose value is always +1.

Here, local energy between the ith spin and the adjacent spin is energy obtained by individually multiplying the coefficients described above by the value of the ith spin and inverting the sign. For example, the value of local energy with the jth spin is −1 when the ith spin is +1, and +1 when the ith spin is −1. Thus, when the ith spin is +1, local energy here becomes smaller. When such local energy is considered on all the adjacent spins and on the external magnetic field coefficient, calculation is made which value is assigned to the ith spin, +1 or −1, to decrease energy. It may be fine to count which one is greater, +1 or −1, in an array of the products of the interaction coefficients and the adjacent spins and the external magnetic field coefficient shown above. In the example above, there are four +1s and two −1s. Supposing that when the ith spin is +1, the sum total of energy is −2, whereas when the ith spin is −1, the sum total of energy is +2. Thus, the subsequent state of the ith spin that energy is minimized can be determined by a majority in which when the number of +1 is greater, the subsequent state of the ith spin is +1, whereas when the number of −1 is greater, the subsequent state of the ith spin is −1.

Figure 3:
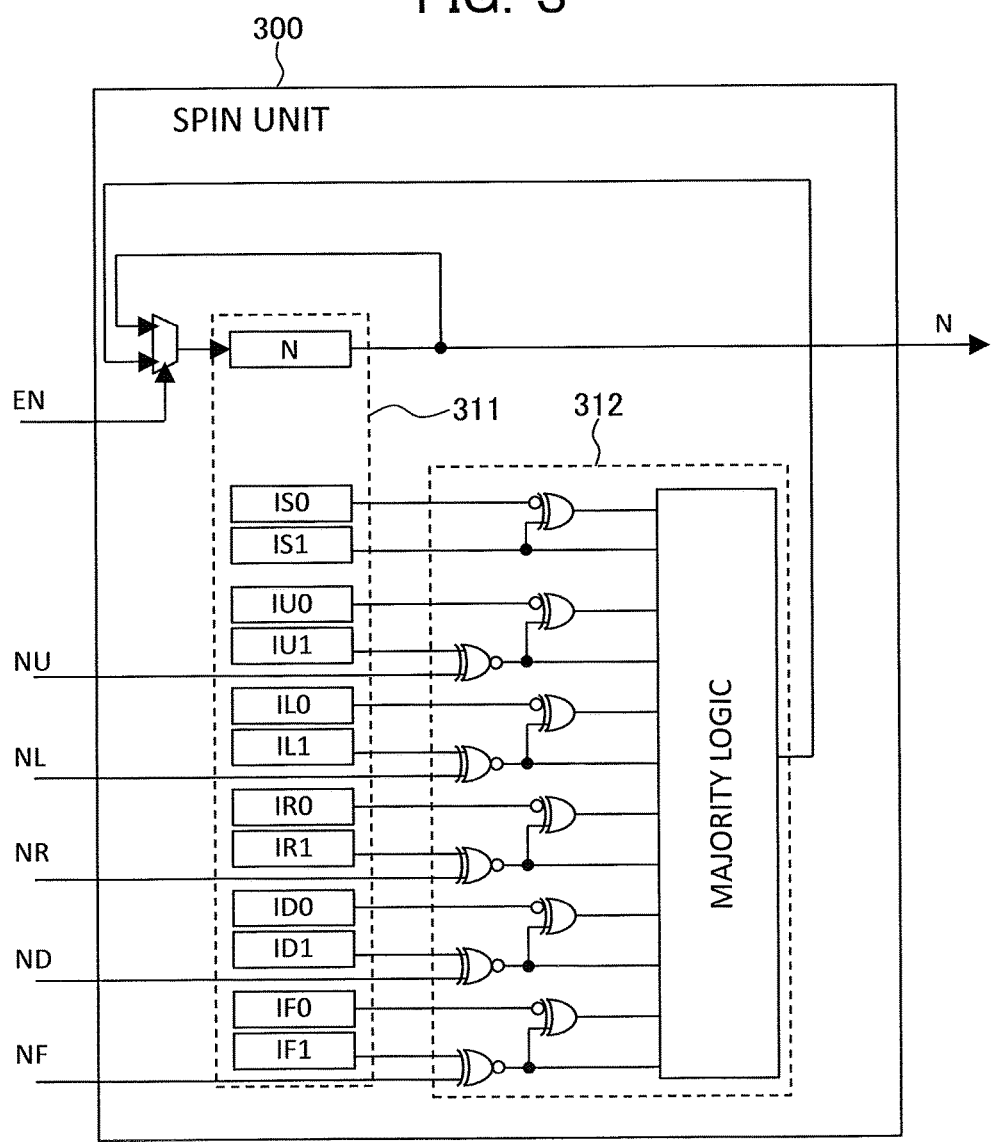
FIG. 3 is a diagram of an exemplary configuration of a spin unit for describing the configuration of a circuit that causes an interaction between spin units.
Figure 4:
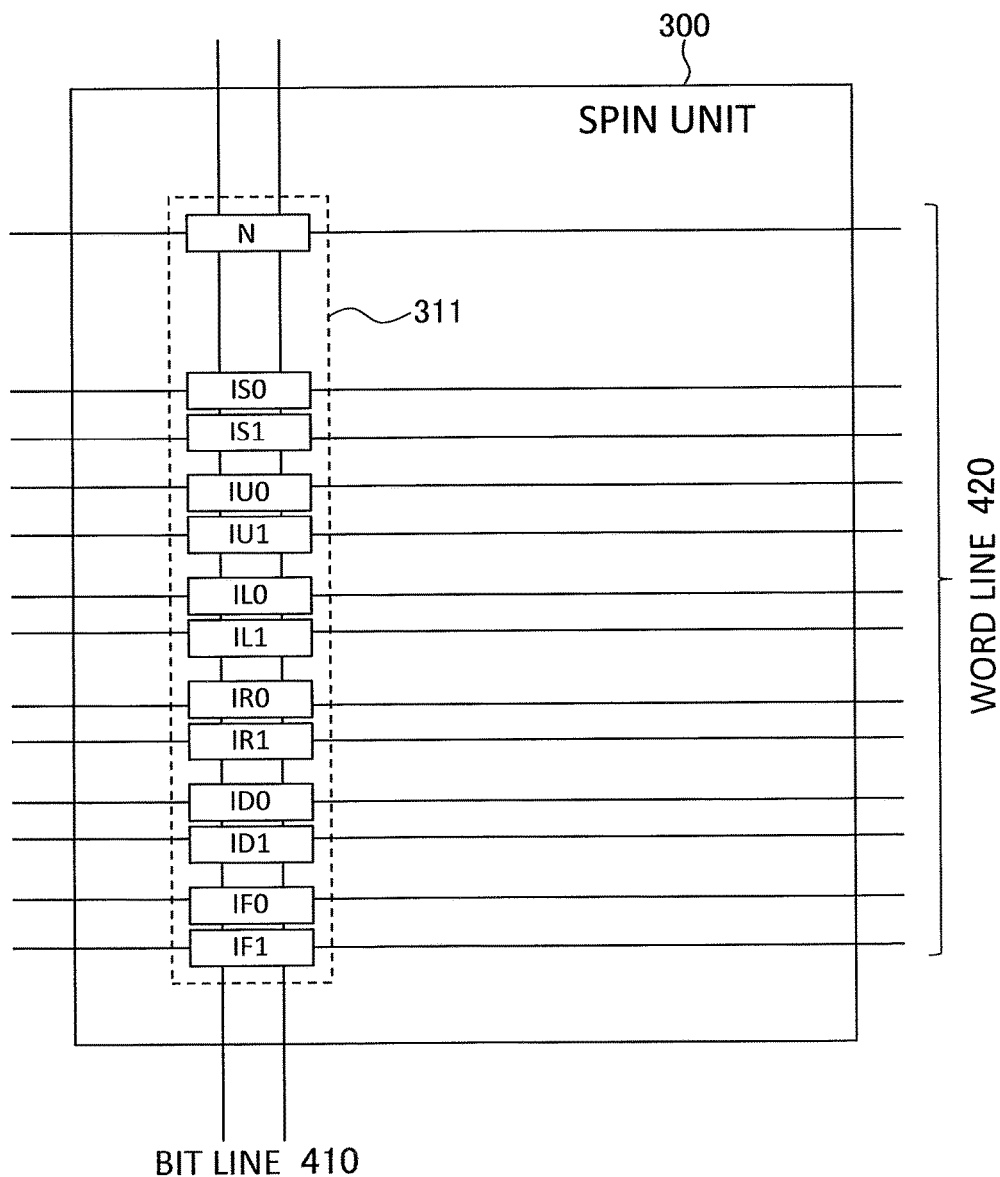
FIG. 4 is a diagram of an exemplary configuration of the spin unit for describing the configuration to make access to memory cells included in the spin unit.

A logic circuit illustrated in the spin unit 300 in FIG. 3 is the circuit that performs the interaction described above. First, based on an exclusive NOR (XNOR) between memory cells expressing the value +1/−1 for the state of the adjacent spin and the interaction coefficient, the subsequent state of the spin that energy is minimized can be calculated when only the interaction is considered (suppose that +1 is encoded to 1 and −1 is encoded to 0). If the interaction coefficient includes only +1 and −1, a decision is made by a majority logic which is greater in the output, +1 or −1, and the subsequent state of the spin can be determined. As for the external magnetic field coefficient, when it is thought that the external magnetic field coefficient always corresponds to the interaction coefficient with the spin in the +1 state, the value of the external magnetic field coefficient is simply the value to be inputted to the majority logic that determines the subsequent state of the spin.

Next, let us consider a method for implementing the coefficient 0. It can be said that when there is a majority logic f having n inputs ($I_1, I_2, I_3, \ldots, I_n$), a proposition below is true. First, suppose that there are replications $I'_1, I'_2, I'_3, \ldots,$ and $I'_n$ for the inputs $I_1, I_2, I^3, \ldots,$ and $I_n$ (for a given k, $I_k = I'_k$). At this time, the output of f ($I_1, I_2, I_3, \ldots, I_n$) is equal to f ($I_1$, $I_2$, $I_3$, ..., $I_n$, $I'_1$, $I'_2$, $I'_3$, ..., $I'_n$) having inputs together with the replications. In other words, even though two each of the input variables are inputted, the output is invariant. Furthermore, suppose that there are another input Ix and inverted !Ix of the input Ix, in addition to the inputs $I_1$, $I_2$, $I_3$, ..., and $I_n$. At this time, the output of f ($I_1$, $I_2$, $I_3$, ..., $I_n$, Ix, !Ix) is equal to f ($I_1$, $I_2$, $I_3$, ..., $I_n$). In other words, when the input variable and the inverted input variable are inputted, they work so as to cancel the influence of the input variable in the majority. The coefficient 0 is implemented using the nature of the majority logic. More specifically, as illustrated in FIG. 3, depending on the value of a bit (IS0, for example) that determines the enable of the coefficient using XOR, the replication of the value to be a candidate for the subsequent state of the spin describe above and the inverted replication are inputted to the majority logic at the same time. For example, in the case where IS0 is zero, the value of IS1 and the inverted value of IS1 are inputted to the majority logic at the same time, the influence of the external magnetic field coefficient is not exerted (this corresponds to that the external magnetic field coefficient is zero). Moreover, in the case where IS0 is one, the value of IS1 and the same value (the replication) as the value of IS1 are inputted to the majority logic at the same time.

(9) Interconnections Between the Spin Units

Figure 9:
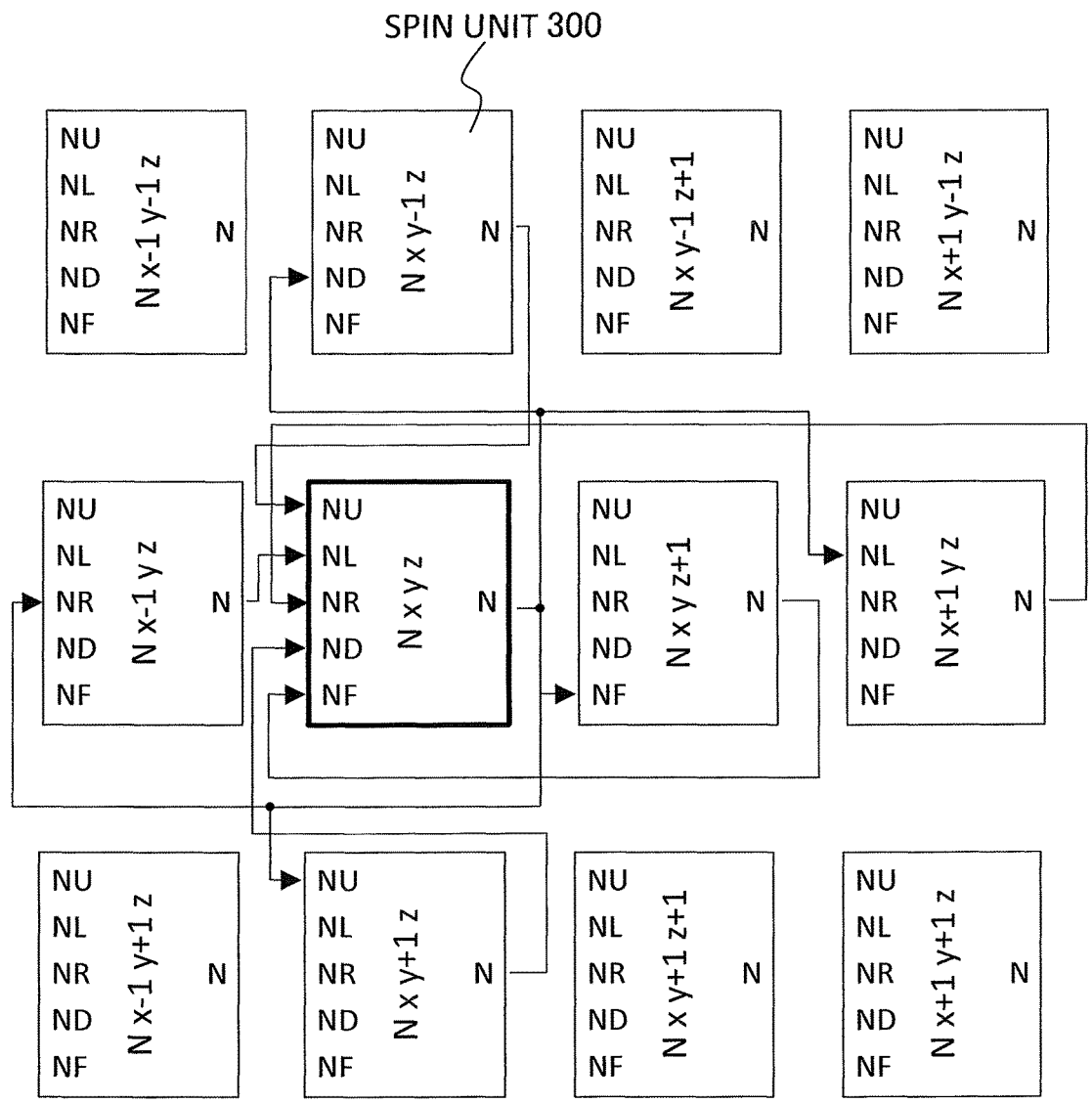
FIG. 9 is a diagram of exemplary interconnections to perform interactions between spin units.

For the interfaces EN, NU, NL, NR, ND, NF, and N of the spin unit illustrated in FIG. 3, the interconnection of EN is as described in FIG. 11. FIG. 9 is examples of the interconnections of NU, NL, NR, ND, NF, and N. FIG. 9 is interconnections necessary to implement the topology as illustrated in FIG. 5 on the spin units disposed as illustrated in FIG. 8 when attention is focused on a single spin unit Nxyz. These interconnections are provided for the individual spin units, so that the topology in FIG. 5 can be implemented.

(10) A Scheme for Avoiding a Local Optimal Solution in a Search for the Ground State of an Ising Model It is possible to implement a search for the ground state of the Ising model to which energy minimization by the interaction between spins is applied as described above. However, it is possible that using only this scheme causes a local optimal solution. Basically, since there is only motion in the direction in which energy is decreased, once the process is trapped into a local optimal solution, the process is not enabled to escape from the local optimal solution, and a global optimal solution is not reached. Therefore, for the action to escape from a local optimal solution, it can be thought that such a scheme is taken into the process of searching for the ground state of the Ising model that the spin array is changed randomly using a unit that inverts (destructs) the values of the spins included in the spin units 300 at a desired probability.

In other words, random bit errors (memory data destruction) are caused on the values of the spins included in the spin units 300. The bit error rate of the memory cell in a typical SRAM is proportional to the supply voltage to the memory cell. The bit error rate is about $10^{-9}$ at a rated voltage of 1V, for example, and the bit error rate is suited to the original purpose of the memory to hold memory data. It is known that when the voltage is further decreased from this voltage, the bit error rate is also degraded in proportion to a decrease in the voltage. For example, the voltage is decreased to about 0.6 V to provide a bit error rate of about $10^{-1}$. It can be thought that the state in which these bit errors are easily generated is used for a scheme for escaping a local optimal solution.

However, when the power supply voltage supplied to the memory cell is simply decreased in order to destruct the memory data of the memory cell N that stores the value of the spin, it is necessary to decrease the power supply voltage to a relatively low voltage (less than 0.2 V with respect to a rated voltage of 1V). Moreover, a fine voltage resolution (about 10% at a voltage of 10 mV) is necessary to control bit error probability (an actually measured value of 65 nm in CMOS).

Figure 29A:
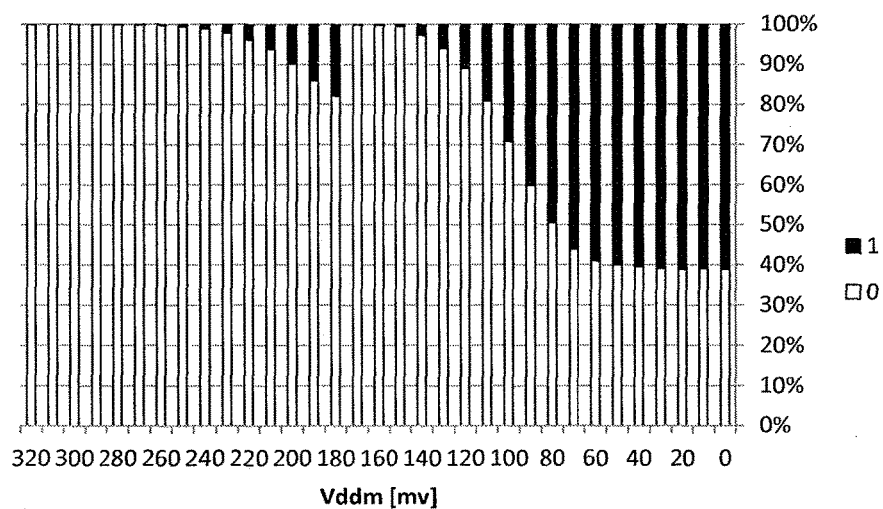
FIGS. 29A and 29B are diagrams of experimental results of the bit error occurrence rate of a memory cell N in the case where a voltage supplied to the memory cell is decreased.
Figure 29B:
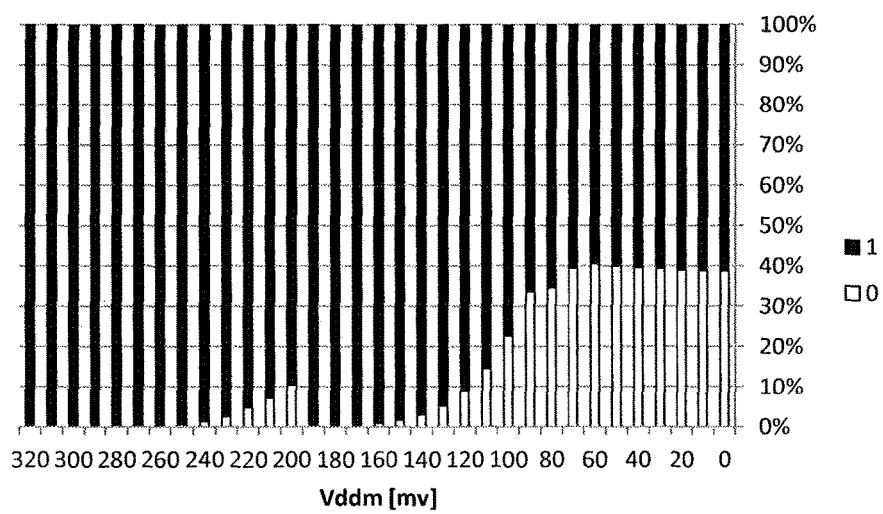

FIGS. 29A and 29B are diagrams of experimental results of the bit error occurrence rate of the memory cell N in the case where a voltage supplied to the memory cell is decreased. FIG. 29A is the ratio (the vertical axis) of the values (0 or 1) of all the memory cells in which the initial values of all the memory cells are turned to zero, the supply voltage is decreased to the voltage on the horizontal axis of a graph, and then the memory cells are read at a normal voltage (a rated voltage of 1V). FIG. 29B is the ratio (the vertical axis) of the values (0 or 1) of all the memory cells in which the initial values of all the memory cells are turned to one, the supply voltage is decreased to the voltage on the horizontal axis of a graph, and then the memory cells are read at a normal voltage (a rated voltage of 1V). In the graph, the failure mode is changed around voltages of 180 to 200 mV, and a variation in errors is very steep with respect to a variation in the voltage in the region in which the voltage is very low. It is revealed that it is difficult to use a variation in the voltage for controlling bit errors.

Moreover, since it is necessary to split a power supply domain to which the memory cells on the Ising chip belong into the memory cell (the spin is stored) whose memory data is desired to destruct and the memory cell (the interaction coefficient and the external magnetic field coefficient are stored) whose memory data is desired to hold, it is difficult to selectively destruct a part of the memory cells in the memory cell array.

Therefore, the inventors have found that the bit error occurrence rate of the memory cell is improved in which the memory cell is caused to do some operation at a power supply voltage supplied to the memory cell, which is not decreased so much. For example, the memory cell is read in a pseudo manner. In other words, the bit line pair is precharged, the potential of the word line is turned to the "H" level for the selection level (an internal normal power supply voltage), and the memory cell is activated.

Figure 30A:
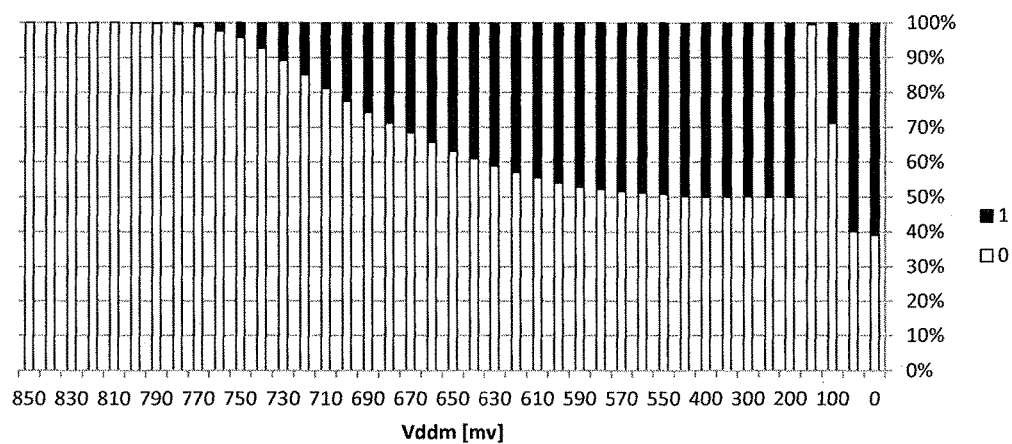
FIGS. 30A and 30B are diagrams of experimental results of the bit error occurrence rate of the memory cell N in the case where a voltage supplied to the memory cell N is decreased and the memory cell N is read in a pseudo manner.
Figure 30B:
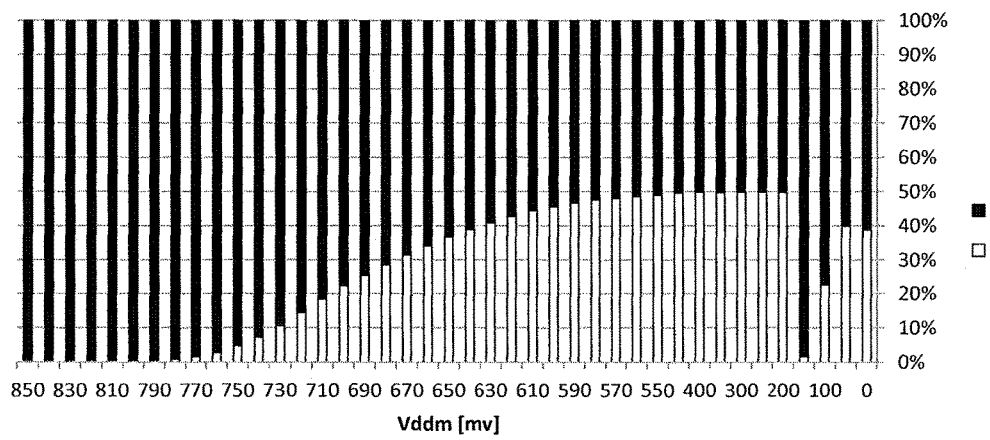

FIGS. 30A and 30B are diagrams of experimental results of the bit error occurrence rate of the memory cell N in the case where a voltage supplied to the memory cell N is decreased and the memory cell N is read in a pseudo manner in comparison with the experimental results in FIGS. 29A and 29B. FIG. 30A is the ratio (the vertical axis) of the values (0 or 1) of all the memory cells in which the initial values of all the memory cells are turned to zero, the supply voltage is decreased to the voltage on the horizontal axis of a graph, dummy read is performed, and then the memory cells are read at a normal voltage (a rated voltage of 1V). FIG. 30B is the ratio (the vertical axis) of the values (0 or 1) of all the memory cells in which the initial values of all the memory cells are turned to one, the supply voltage is decreased to the voltage on the horizontal axis of a graph, dummy read is performed, and then the memory cells are read at a normal voltage (a rated voltage of 1V). In the graph, the data of the memory cell starts to destruct at a voltage of about 800 mV, and the relationship between a variation in the voltage and a variation in errors is very smooth as compared with the results in FIGS. 29A and 29B. Thus, a fine voltage resolution can be obtained for control of bit error probability.

Therefore, in combination with the scheme to slightly decrease the voltage supplied to the memory cell array, a unit that reads the memory cell in a pseudo manner is used to cause random bit errors (memory data destruction) on the values of the spins included in the spin units 300, and falling into a local optimal solution is avoided in the process of searching for the ground state of an Ising model. To this end, in the Ising chip according to the present embodiment, as illustrated in FIG. 1, the memory cell power supply line 141 that supplies the power supply voltage to the memory cells of the spin units 300 configuring the spin array 110 and can variably control the voltage is provided separately from the normal power supply line 142 that supplies the power supply voltage to the other circuits. As illustrated in FIG. 3, in the spin unit 300, the memory cell power supply domain 311 is separated from a logic power supply domain 312. It is noted that operations to read values from and write values to the memory cell array are referred to as a normal operation mode, and an operation to intentionally generate errors on the values stored on the memory cell array is referred to as a memory data destruction mode.

(11) The Control Procedures of the Ising Chip

Figure 22:
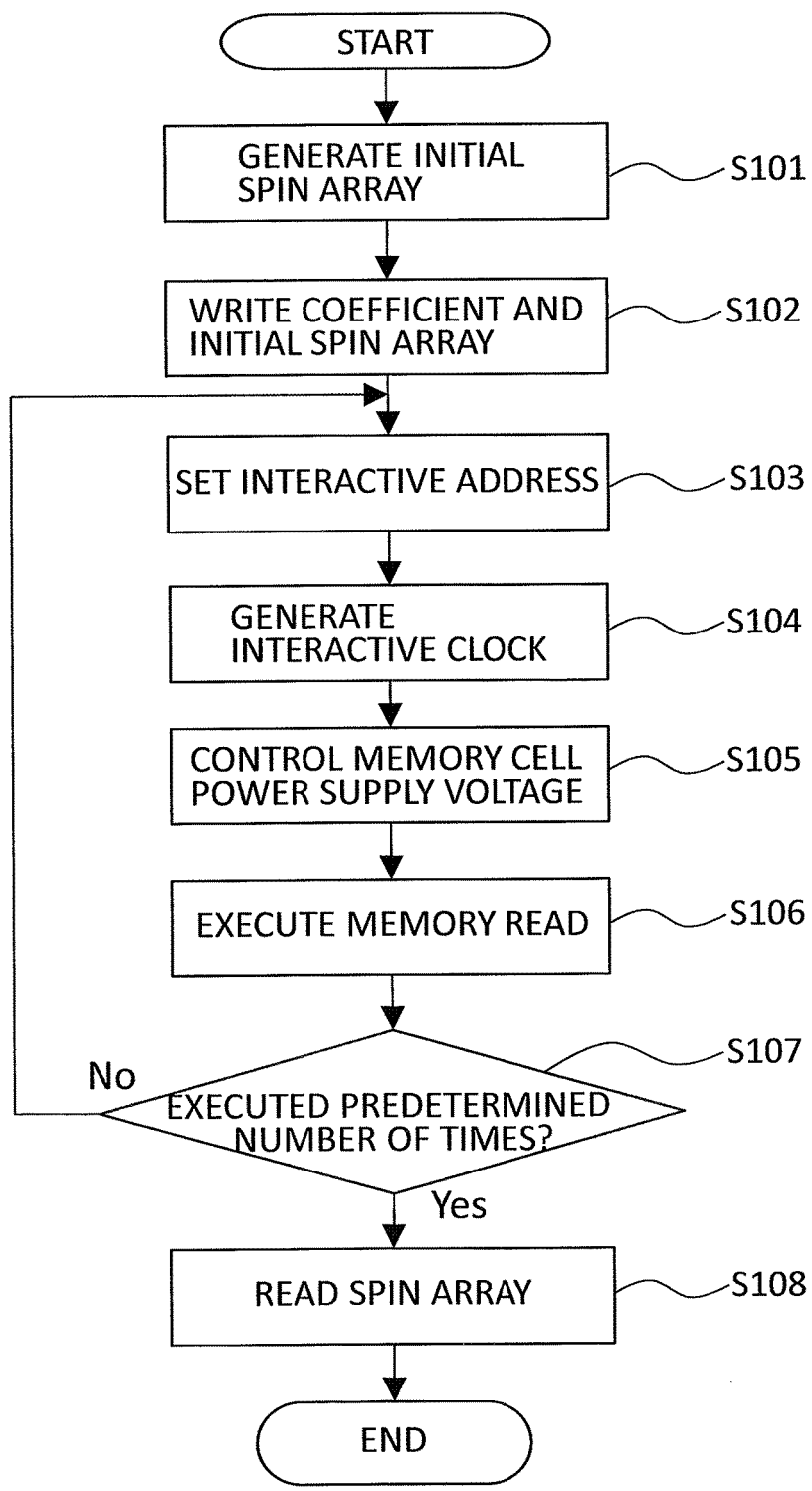
FIG. 22 is a first embodiment of procedures in which a CPU controls the Ising chip to perform a ground state search process on an information processor.

FIG. 22 is the procedures in which the CPU 210 controls the Ising chip 100 to perform the ground state search process on the information processor 200 mounted with the Ising chip 100.

In Step S101, an initial spin array, which is the initial value of the spin array, is generated. For the generation of the initial spin array, the spin array is randomly generated using a random number.

In Step S102, the interaction coefficient and the external magnetic field coefficient of the Ising model, which are generated in advance and express an optimization problem desired to solve, and the initial spin array obtained in Step S101 are written on the memory cells of the spin units 300 of the Ising chip 100 in the normal operation mode. The initial setting is thus completed.

After that, in Step S103, the interactive address 180 is inputted to the Ising chip 100. In the present embodiment illustrated in FIG. 11, the interactive address is expressed by an identifier for group A or for group B, and is alternately set.

In Step S104, the interactive clocks 181 are sequentially inputted, one of the interactive addresses set in Step S103 is decoded at the interactive address decoder 140 in synchronization with the interactive clock 181 for every input of the interactive clocks 181, and the group A specification signal 143 or the group B specification signal 144 is sent to all the spin units 300 belonging to the appropriate group. In synchronization with the interactive clock 181, all the spin units 300 in the appropriate group interact with one another. The interaction above is repeated for every input of the interactive clock 181, and the number of times of interactions is the number of the interactive addresses set in Step S103. In other words, an appropriate number of times of interactions is specified repeatedly on group A and group B for execution. Thus, the process of searching for the ground state of the Ising model proceeds for the number of times of execution.

In Step S105, the power supply voltage 141 supplied to the memory cells of all the spin units 300 configuring the spin array 110 is supplied as a voltage specified by the rated value is decreased.

In Step S106, under the conditions for the memory cell power supply voltage controlled in Step S105, the memory cell N that stores the spins of all the spin units 300 is subjected to dummy read. In other words, such control is performed in which a precharge voltage is applied to the bit lines connected to the memory cells N and then the potential of the word lines connected to the memory cells N is set to the "H" level for the selection level (an internal normal power supply voltage).

In the operations in Step S105 to S106, the memory cell array is in the memory data destruction mode for that period.

Figure 31:
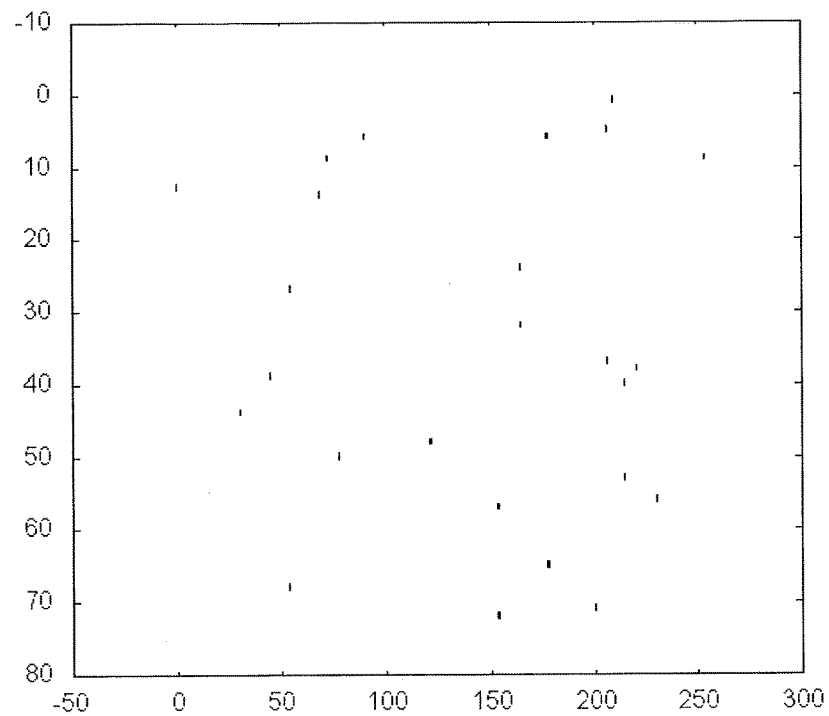
FIG. 31 is a diagram of an experimental result in the case where a power supply voltage is decreased and dummy read is performed on the memory cells N storing the spins of 20K spin units in which all the initial values of the memory cells are set to one, and the voltage is decreased to 0.8 V for dummy read.
Figure 32:
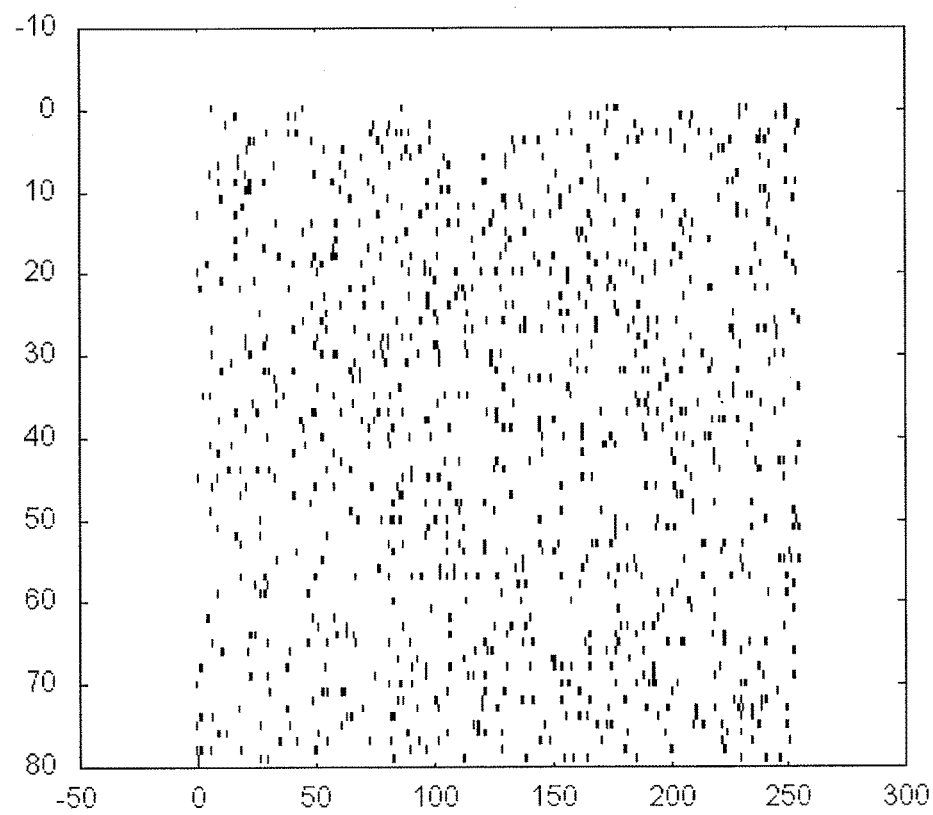
FIG. 32 is a diagram in the case where all the initial values of the memory cells are set to one and the voltage is decreased to 0.75 V for dummy read.
Figure 33:
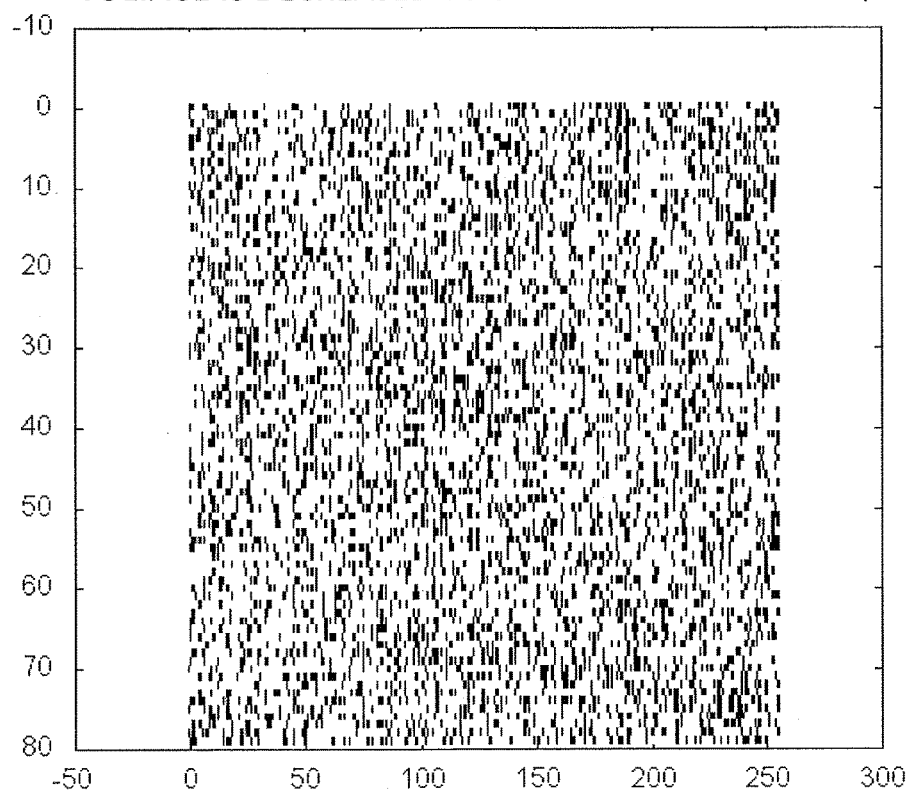
FIG. 33 is a diagram in the case where all the initial values of the memory cells are set to one and the voltage is decreased to 0.7 V for dummy read.
Figure 34:
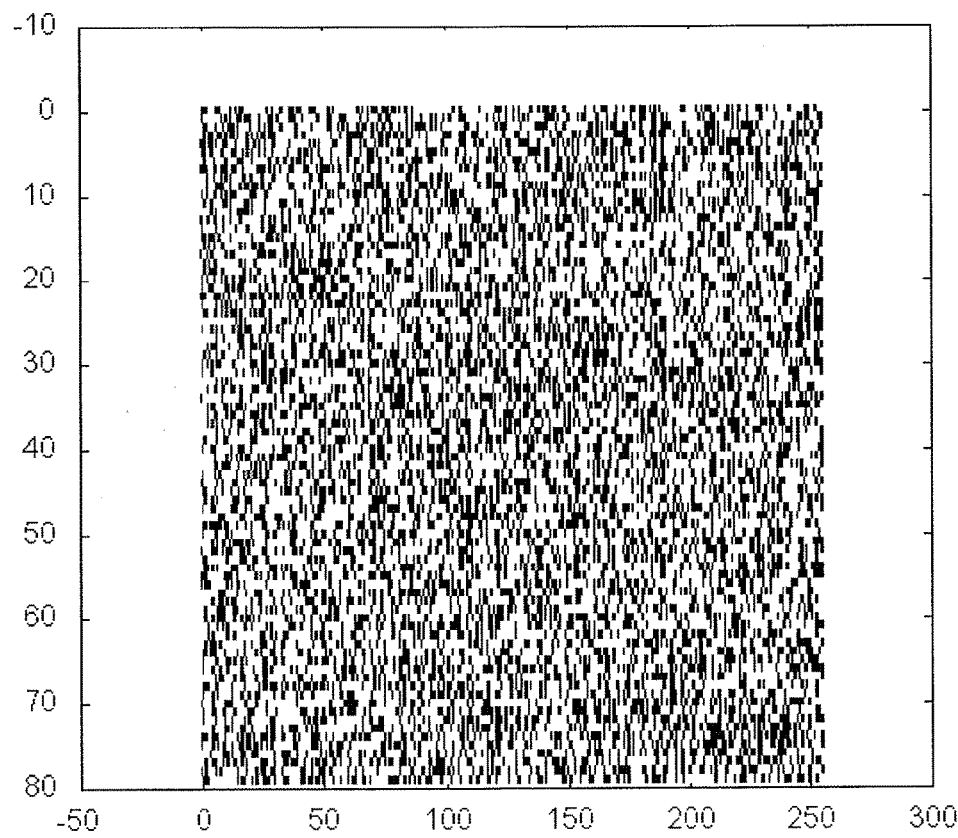
FIG. 34 is a diagram in the case where all the initial values of the memory cells are set to one and the voltage is decreased to 0.65 V for dummy read.
Figure 35:
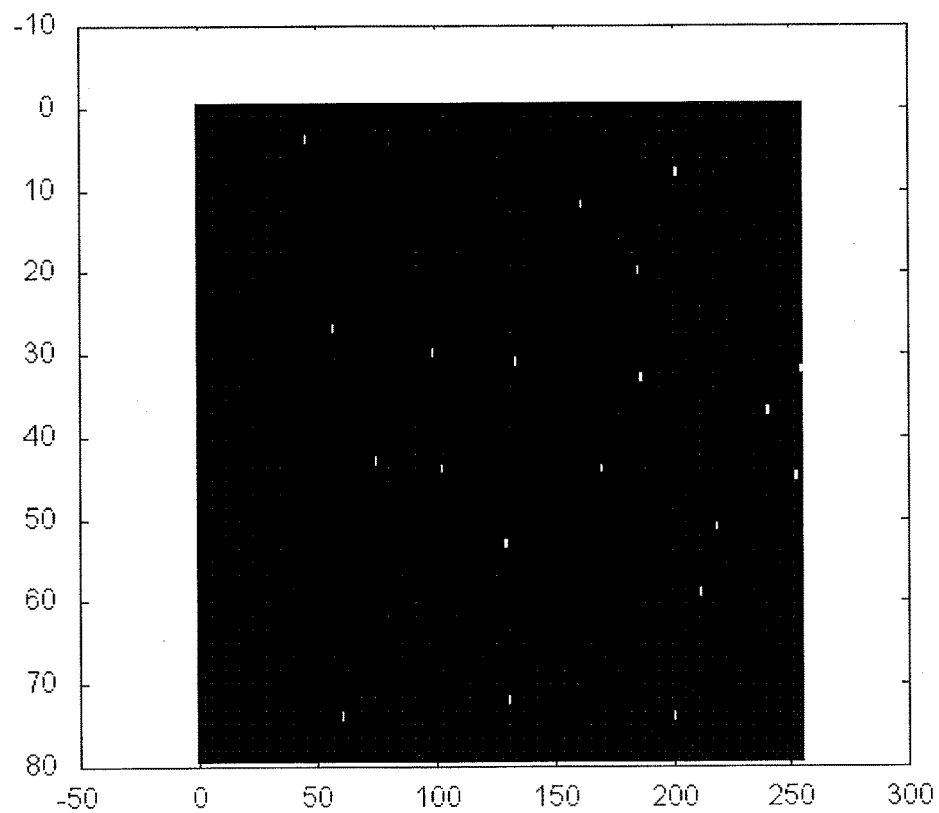
FIG. 35 is a diagram in the case where all the initial values of the memory cells are turned to zero and the voltage is decreased to 0.8 V for dummy read.
Figure 36:
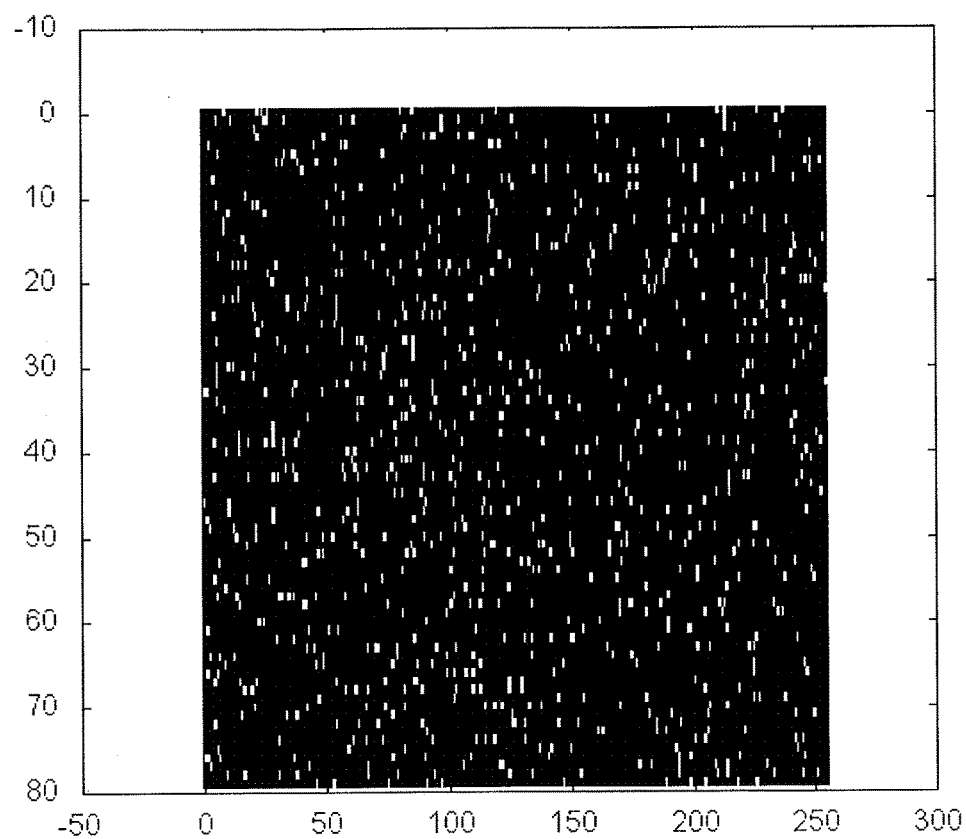
FIG. 36 is a diagram in the case where all the initial values of the memory cells are turned to zero and the voltage is decreased to 0.75 V for dummy read.
Figure 37:
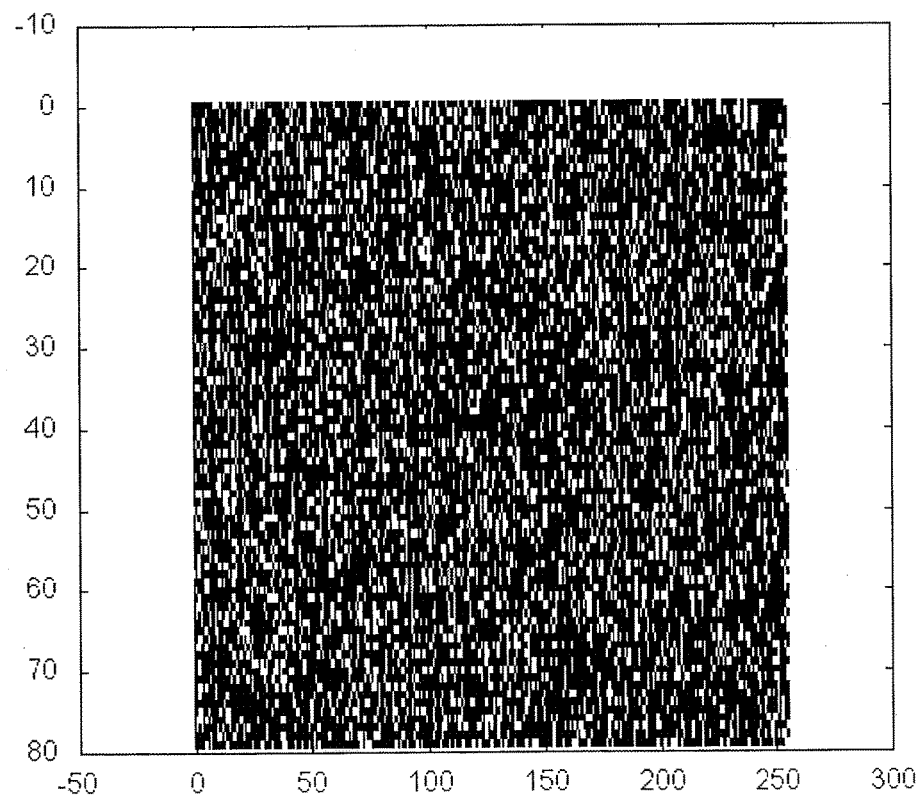
FIG. 37 is a diagram in the case where all the initial values of the memory cells are turned to zero and the voltage is decreased to 0.7 V for dummy read.
Figure 38:
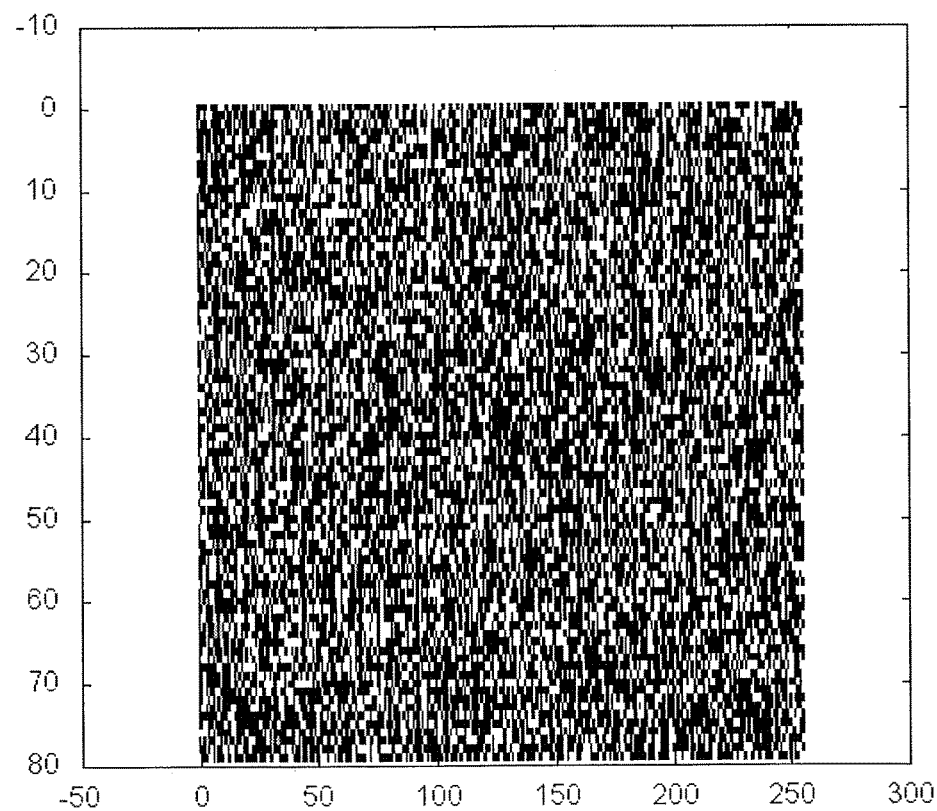
FIG. 38 is a diagram in the case where all the initial values of the memory cells are turned to zero and the voltage is decreased to 0.65 V for dummy read.

Control in Step S106 is performed, and bit errors are generated on the memory cells N at the occurrence probability corresponding to the graphs illustrated in FIGS. 30A and 30B. FIGS. 31 to 38 are the bit patterns of all the memory cells N in the experimental result in which dummy read is applied to 20K memory cells N that store the spins of the spin units 300 (256×80=20K) configuring a sample spin array 110 in order to confirm randomness of the generation of the bit errors as the power supply voltage is decreased. The horizontal axis in FIGS. 30A and 30B expresses 0 to 255 and the vertical axis expresses 0 to 79 for the bit pattern of 20K memory cell (256×80=20K), in which a white portion expresses the memory cell value =1, and a black portion expresses the memory cell value =0. FIG. 31 is a diagram in the case where all the initial values of the memory cells are set to one and the voltage is decreased to 0.8 V for dummy read. FIG. 32 is a diagram in the case where all the initial values of the memory cells are set to one and the voltage is decreased to 0.75 V for dummy read. FIG. 33 is a diagram in the case where all the initial values of the memory cells are set to one and the voltage is decreased to 0.7 V for dummy read. FIG. 34 is a diagram in the case where all the initial values of the memory cells are set to one and the voltage is decreased to 0.65 V for dummy read. FIG. 35 is a diagram in the case where all the initial values of the memory cells are turned to zero and the voltage is decreased to 0.8 V for dummy read. FIG. 36 is a diagram in the case where all the initial values of the memory cells are turned to zero and the voltage is decreased to 0.75 V for dummy read. FIG. 37 is a diagram in the case where all the initial values of the memory cells are turned to zero and the voltage is decreased to 0.7 V for dummy read. FIG. 38 is a diagram in the case where all the initial values of the memory cells are turned to zero and the voltage is decreased to 0.65 V for dummy read.

It is revealed that bit errors are randomly generated on the bit patterns of all the memory cells N in FIGS. 31 to 38.

As a result of the process in Step S106, some of the values of the spins of the memory cells N of all the spin units 300 configuring the spin array 110 are randomly changed in such a manner that the values of the spins falling into a local optimal solution are reached at a global optimal solution in the state in which a search for the ground state of the Ising model proceeds by interactions in Step S104.

In the end of the process in Step S106, the power supply voltage 141, which is supplied to the memory cells of all the spin units 300 configuring the spin array 110 as a voltage specified by the rated value is decreased in Step S105, is returned to the original rated value (a voltage of 1V in the present embodiment). After the voltage is returned to the original rated value, the memory cell array is in the normal operation mode.

In Step S107, it is determined whether the process of searching for the ground state of an Ising model is performed a sufficient number of times for processing until a global optimal solution is reached. In the case where the process is performed a predetermined number of times in advance set for a parameter, the operation goes to Step S108, whereas in the case where the process is not performed a predetermined number of times, the operation returns to Step S103, and a series of the processes to Step S106 is repeated.

Figure 23:
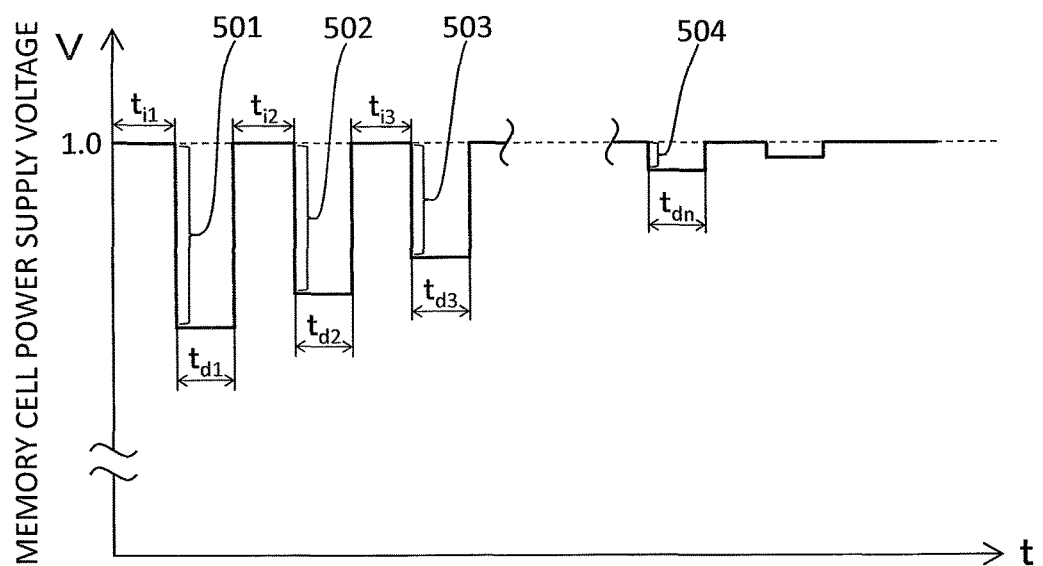
FIG. 23 is a diagram of exemplary control of a memory cell power supply voltage in the flowchart in FIG. 22.

Here, FIG. 23 is a process of repeating a series of the processes from Step S103 to Step S106 described above in a graph on which a lapse of time (the horizontal axis) and the transition of control of the memory cell power supply voltage 141 (the vertical axis) are plotted. The origin point (the coordinates) of the horizontal axis of the graph in FIG. 23 expresses a time instant at which the interactive address 180 is set in Step S103 for the first time, the interactive clock 181 is inputted in Step S104, and the group of the spin units 300 corresponding to the first interactive address starts interactions in synchronization with the first interactive clock 181. The memory cell power supply voltage 141 at this time is set to a rated voltage of 1V. For the period for which interactions are repeated by a plurality of addresses set at the interactive address 180, the memory cell power supply voltage 141 is supplied at a rated voltage of 1V.

In FIG. 23, interactions are repeated for the number of addresses set at the interactive address 180, and the time period is defended as $t_{i1}$.

Subsequently, the memory cell power supply voltage 141 for the first time in Step S105 is controlled in such a manner that the memory cell power supply voltage 141 is decreased by a voltage 501 specified by the rated value and supplied. In Step S106, the memory cell N that stores the spins of all the spin units 300 is subjected to dummy read. The time period required for the dummy read is defined as $t_{d1}$. After that, the memory cell power supply voltage 141 is returned to the rated value (1V), the setting of the interactive address 180 for the second time is again accepted in Step S103. In Step S104, interactions for the second time are repeated according to the accepted number of the interactive addresses. The duration is defined as $t_{i2}$.

Subsequently, in Step S105, the memory cell power supply voltage 141 for the second time is controlled in such a manner that the memory cell power supply voltage 141 is decreased by a voltage 502 specified by the rated value and supplied. Here, the memory cell power supply voltage 141 is controlled in such a manner that the reduced voltage 502 for the second time is smaller than the reduced voltage 501 for the first time. Moreover, the memory cell power supply voltage 141 is controlled in such a manner that the reduced voltage is sequentially further reduced as a reduced voltage 503 for the third time, ..., a reduced voltage 504 for the nth time, and so on. As a result, the fact that the occurrence probability of bit errors sequentially becomes smaller by dummy read for the memory cell N in Step S106 later is as shown in the experimental results in FIGS. 31 to 38.

By the process of repeating a series of the processes from Step S103 to Step S106 described above, the avoidance scheme is executed in which bit errors are generated on the memory cell N that stores the value of the spin every time the interactions are executed the specified number of times for a search for the ground state of the Ising model in order to escape from a local optimal solution. Also in the avoidance scheme, such control is performed in which a process is performed to sequentially decrease the occurrence probability of bit errors and the search for the ground state of the Ising model is finally converged on a global optimal solution.

Under the situations described above, energy is basically transitioned to a smaller state due to interactions. The state is concurrently and randomly transitioned because of bit errors, so that a transition to a state which is not reached only by interactions can also be generated, and a wide solution space can be searched. With the advance of the ground state search, the voltage is changed step by step into a state in which the bit error rate does not easily occur in order to stabilize the state. In other words, a voltage of 0.65V, for example, at which the bit error rate easily occurs, is first set, and then the voltage is brought to a voltage of 1V at which the bit error rate does not easily occur. In combination of scheduling the supply voltage with energy minimization due to interactions, it is possible to implement a ground state search that aims a global optimal solution while escaping from a local optimal solution.

In Step S107 in FIG. 22, the search for the ground state of the Ising model is performed for the preset number of times of repetition that the search is considered to be converged on a global optimal solution. In Step S108, the value of the spin is read out of the memory cells N that store the values of the spins of all the spin units 300 configuring the spin array 110 that finishes the ground state search process.

After the ground state search process described above is finished, a problem transformation program (not shown) executed on the CPU 210 of the information processor 200 transforms the value of the spin array read in Step S108 into the solution of the optimization problem desired to solve, and the solution is presented to a user.

(12) Multiword Operation The Ising chip 100 according to the present embodiment includes the SRAM compatible interface 150, and can write the initial value to the memory cells of all the spin units 300 configuring the spin array 110, and can read the spin array of the arithmetic operation result. However, from the characteristics of regularly arrayed initial values of the Ising model, necessity arises in that the same data is continuously written or a process is necessary to perform read in a pseudo manner in order to randomly destruct memory data of the memory cell N that stores the spin described above. Therefore, such a scheme is effective in which such control is enabled to activate a plurality of the word lines at the same time and concurrent write to and read from a plurality of the memory cells is enabled.

Therefore, in SRAM, manipulation is performed generally on a single word line according to a row address selected at an address decoder. On the other hand, in the multiword decoder 130 according to the present embodiment, it is possible to perform control in which a plurality of the word lines is activated at the same time.

Figure 27:
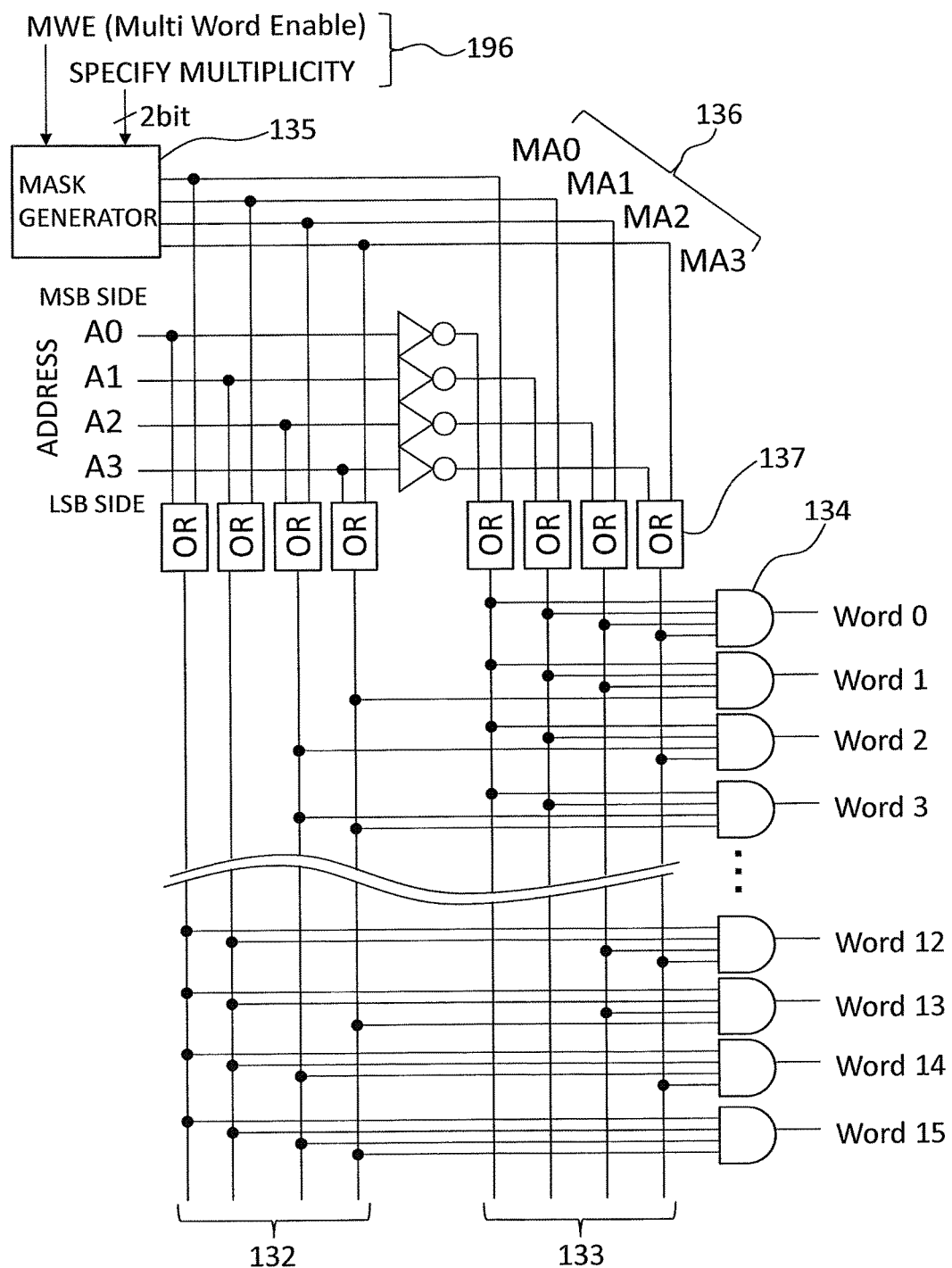
FIG. 27 is a diagram of the configuration of a multiword decoder.
Figure 28:
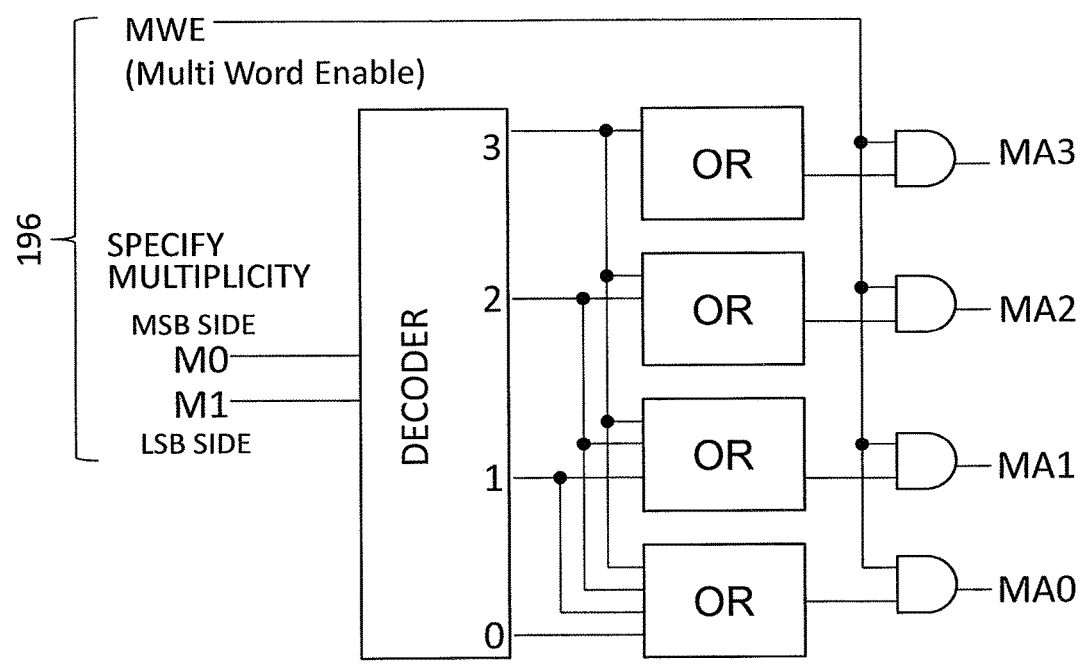
FIG. 28 is a diagram of the configuration of a mask generator.

FIGS. 27 and 28 are an exemplary configuration of the multiword decoder 130.

The configuration of a typical address decoder includes address bit lines 132 and inverted bit lines 133, the bit lines 132 and the inverted bit lines 133 are connected to all the address patterns using an AND gate 134, and word lines are outputted. In the present embodiment, in order to specify a plurality of addresses at the same time, a mask generator 135 is provided on the address decoder. An OR gate 137 for a bit 136 outputted from the mask generator and an address bit is additionally provided, the values of the address bit lines 132 and the inverted bit lines 133 can be turned into one at the same time using the mask bits (MA0, MA1, MA2, MA3) 136, so that a plurality of the word lines can be activated at the same time.

FIG. 28 is the configuration of the mask generator 135. An MWE (Multi Word Enable) signal of one bit and a multiplicity specify signal 196 of two bits are received through the external interface of the Ising chip 100, and the mask bits (MA0, MA1, MA2, MA3) of four bits are outputted. When the values of the mask bits are one, ×2 word lines are selected. In the present embodiment, any one of ×2, ×4, ×8, and ×16 word lines is selected. Addresses (A0, A1, A2, A3) illustrated in FIG. 27 correspond to the addresses of the last four digits of a reference word address inputted from the address bus 190, for example, and the mask bits are used to select a plurality of addresses.

The configuration of the multiword decoder shown in the present embodiment is an example, and the similar effect can be thought even though the other configurations are adopted.

It is possible to set the selection of a plurality of the word lines according to the multiplicity specify signal 196 from the outside of the Ising chip 100. However, the allowable multiplicity (the number of word lines selected at the same time) depends on the supply performance of the power supply and the drive performance of the bit line, and the number of word lines selected at the same time is limited. It can be said that about four to eight word lines, for example, are practical.

The multiword decoder 130 activates a plurality of the word lines, so that dummy read of the memory cell in Step S106 in FIG. 22 can be efficiently performed, and such an effect is exerted that the time periods $t_{d1}, \ldots, t_{dn}$, for the process of avoiding a local optimal solution illustrated in FIG. 23 are also greatly shortened.

Second Embodiment

A second embodiment of the scheme for avoiding a local optimal solution in the search for the ground state of the Ising model described in the first embodiment is shown.

In the present embodiment, the configuration will be described mainly on the expansion of the function of the bit line driver 120.

Figure 12:
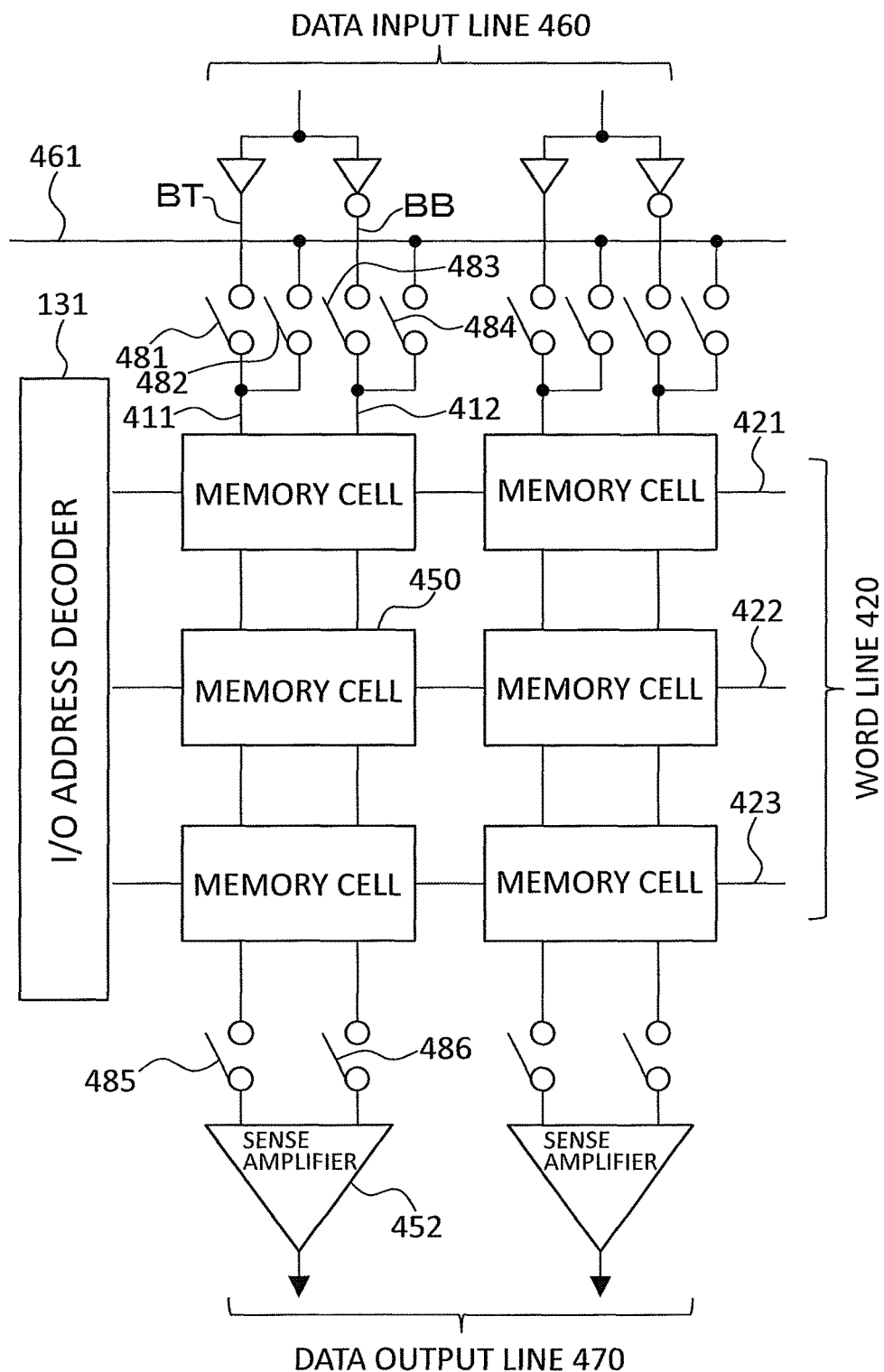
FIG. 12 is a diagram of the configuration of a typical SRAM included in the Ising chip.

FIG. 12 is the configuration of a typical SRAM, and the configuration is also provided on the Ising chip 100 in FIG. 1.

An I/O address decoder 131 in FIG. 12 is a circuit to be the base of the multiword decoder 130 in FIG. 1. Memory cells 450 are the separate memory cells included in the spin array 110 in FIG. 1 that are arrayed in FIG. 12. Moreover, a part of the circuit configuration for data write/read through the bit lines included in the bit line driver 120 in FIG. 1 and included in a typical SRAM is illustrated in the upper part and the lower part of the memory cell array in FIG. 12.

FIG. 12 illustrates a data input line 460 that supplies write data as opposite bit data to bit line pairs BT and BB, a precharge voltage line 461 that supplies a precharge voltage, switching devices 481 to 484 that switch supply of write data and the precharge voltage to the bit lines, a sense amplifier 452 that reads data out of the memory cell, and a data output line 470 that externally outputs read data. Moreover, word lines 420 corresponding to row selection addresses are connected from the I/O address decoder 131 to the memory cells 450.

Figure 13:
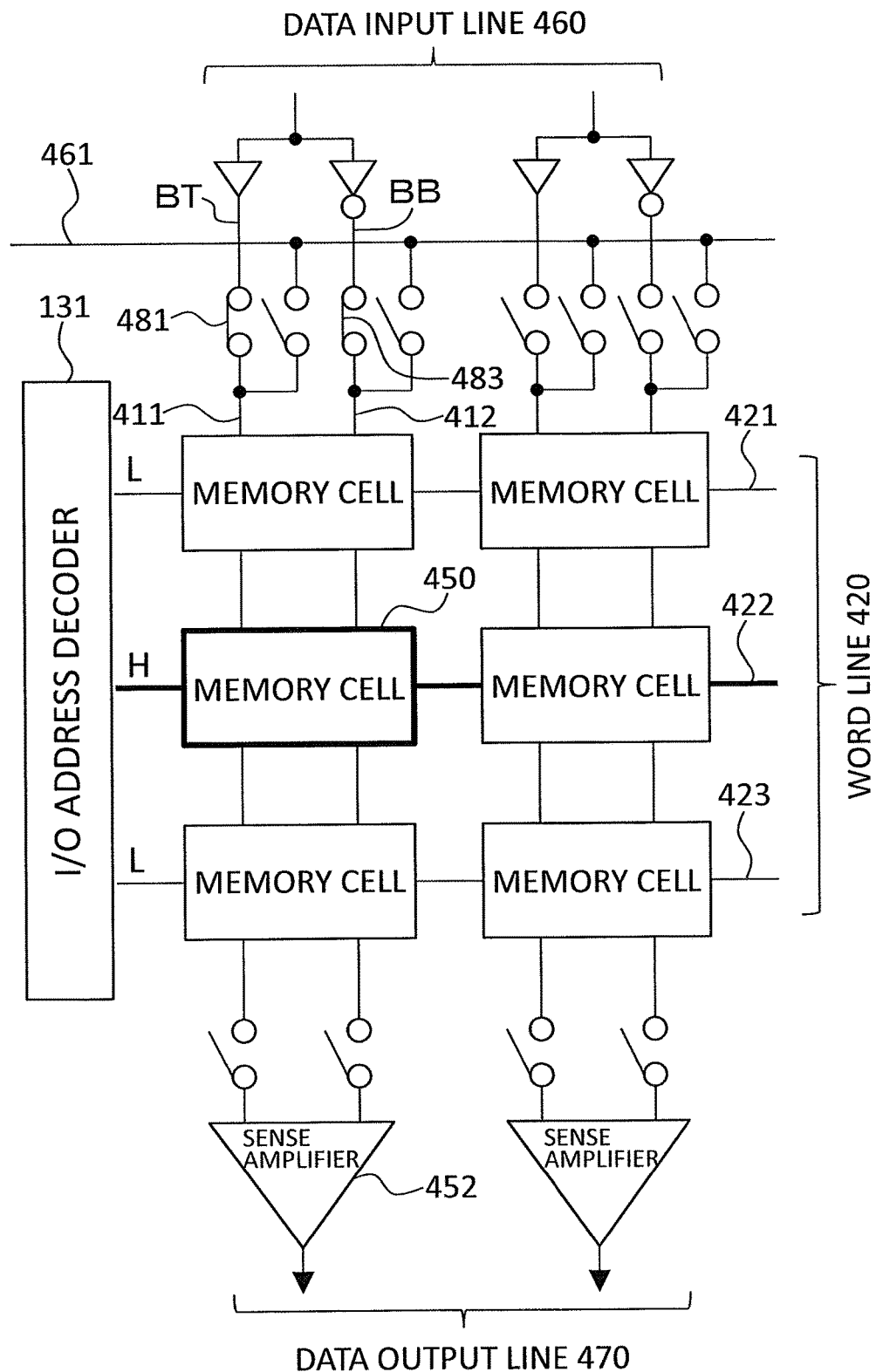
FIG. 13 is a diagram illustrative of a write operation to memory cells in the configuration of a typical SRAM included in the Ising chip.

FIG. 13 is the configuration equivalent to the typical SRAM illustrated in FIG. 12, in which in the write operation to the memory cell 450, the potential of the word line 422 is turned to the "H" level for the selection level (an internal normal power supply voltage), the switching devices 481 and 483 are connected, and write data is written through the bit line pairs 411 and 412.

Figure 14:
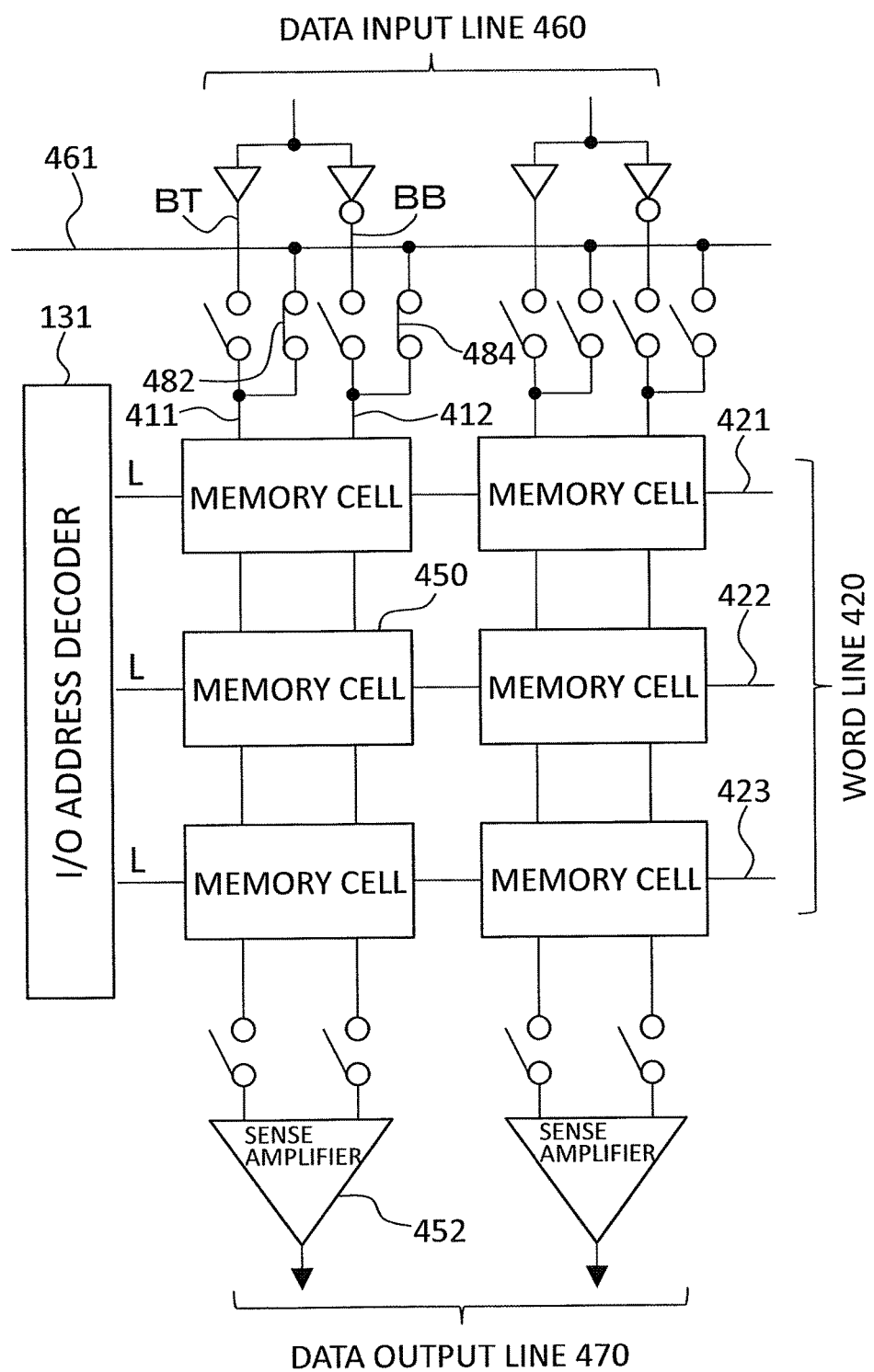
FIG. 14 is a diagram illustrative of a precharge operation in the configuration of a typical SRAM included in the Ising chip.

FIG. 14 is the configuration equivalent to the typical SRAM illustrated in FIG. 12, in which prior to the read operation from the memory cell, the switching devices 482 and 484 are connected, the precharge voltage line 461 is connected to the bit line pairs 411 and 412, and the voltages of both of the bit lines 411 and 412 are turned to the "H" level (an internal normal power supply voltage).

Figure 15:
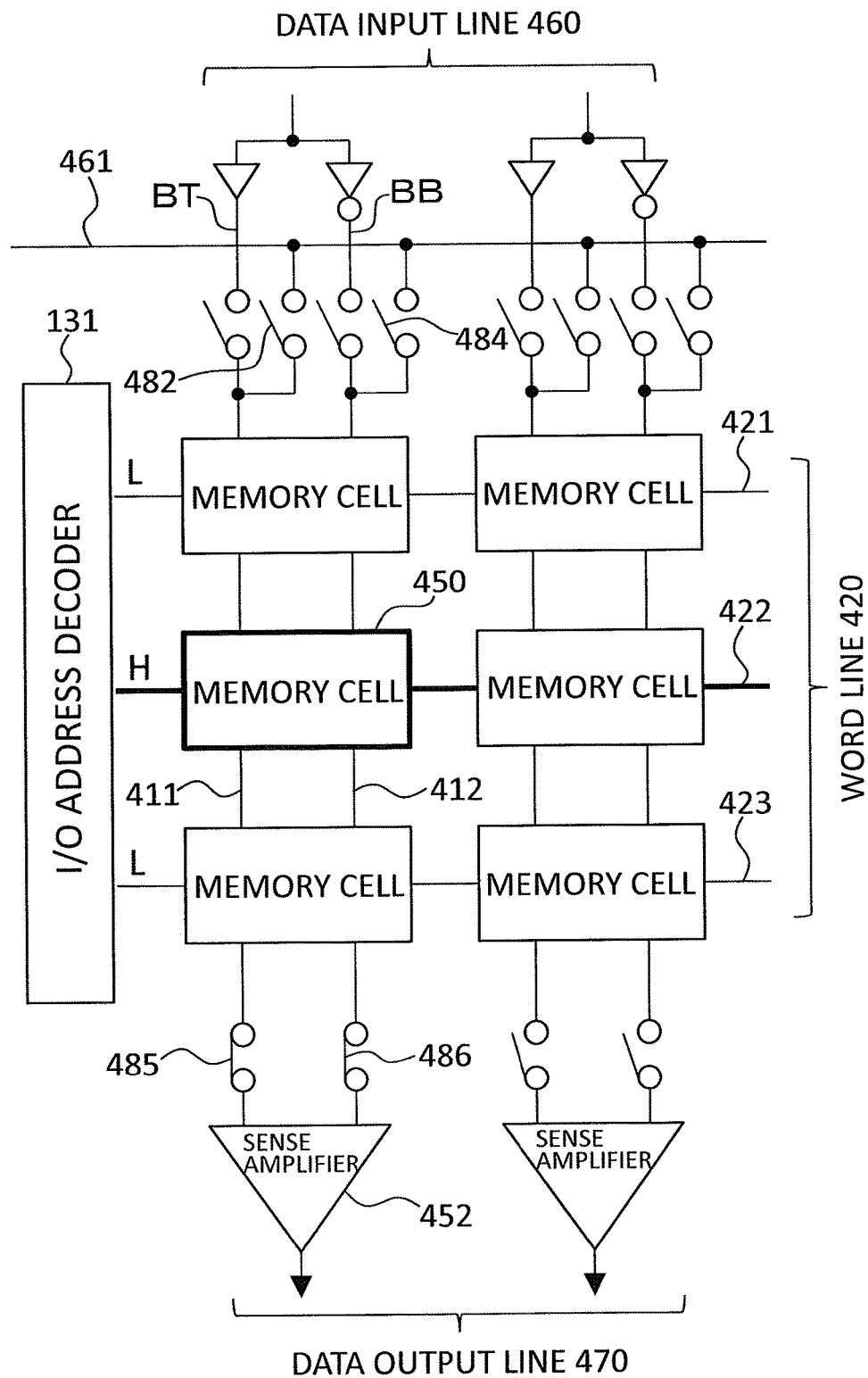
FIG. 15 is a diagram of a configuration in which a memory cell is read upon precharge in the configuration of a typical SRAM included in the Ising chip.

FIG. 15 is the configuration in which both of the bit lines 411 and 412 in FIG. 14 are precharged, the switching devices 482 and 484 are turned off, the potential of the word line 422 is turned to the "H" level for the selection level, and the potential stored on the memory cell 450 is read to the bit line pairs 411 and 412. The switching devices 485 and 486 are connected, the voltage across the bit line pairs 411 and 412 is amplified at the sense amplifier 452 for detection, and stored data on the memory cell 450 is outputted to the data output line 470.

Figure 16:
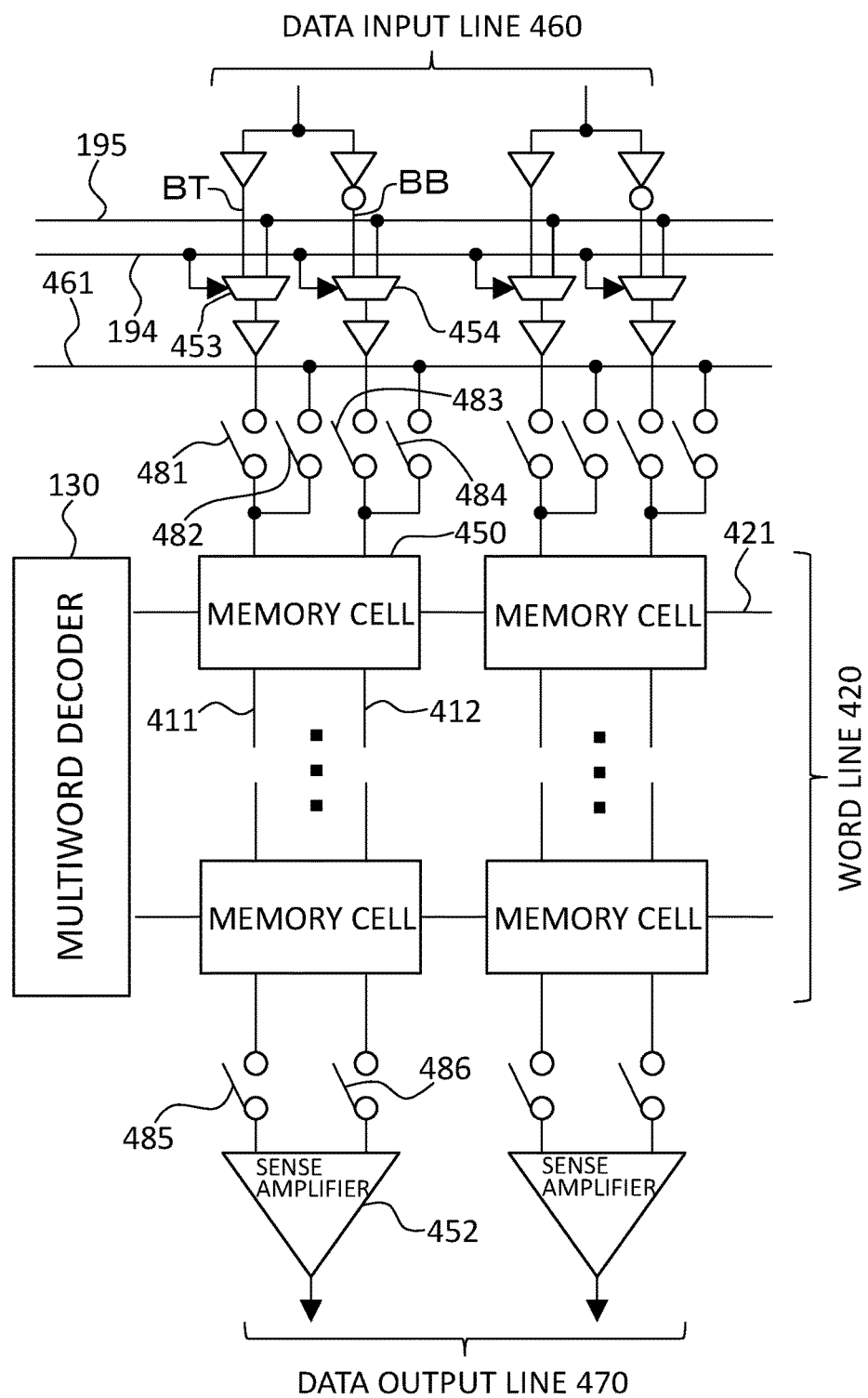
FIG. 16 is a diagram of a configuration in which a bit destruction line, a selection line, and a multiword decoder are connected in addition to the configuration of a typical SRAM included in the Ising chip.

FIG. 16 is the configuration in which in addition to the configuration of the typical SRAM illustrated in FIG. 12, external signals (bit line control signals) to cause bit errors (memory data destruction) on the memory cell are inputted to the bit line driver 120 in FIG. 1, the bit lines BT and BB and the bit destruction line 195 are connected to selectors 453 and 454 inside the bit line driver 120, and the selection line 194 is connected for selection of the selector.

Moreover, it is possible to perform control to activate a plurality of the word lines at the same time using the multiword decoder 130.

Figure 17:
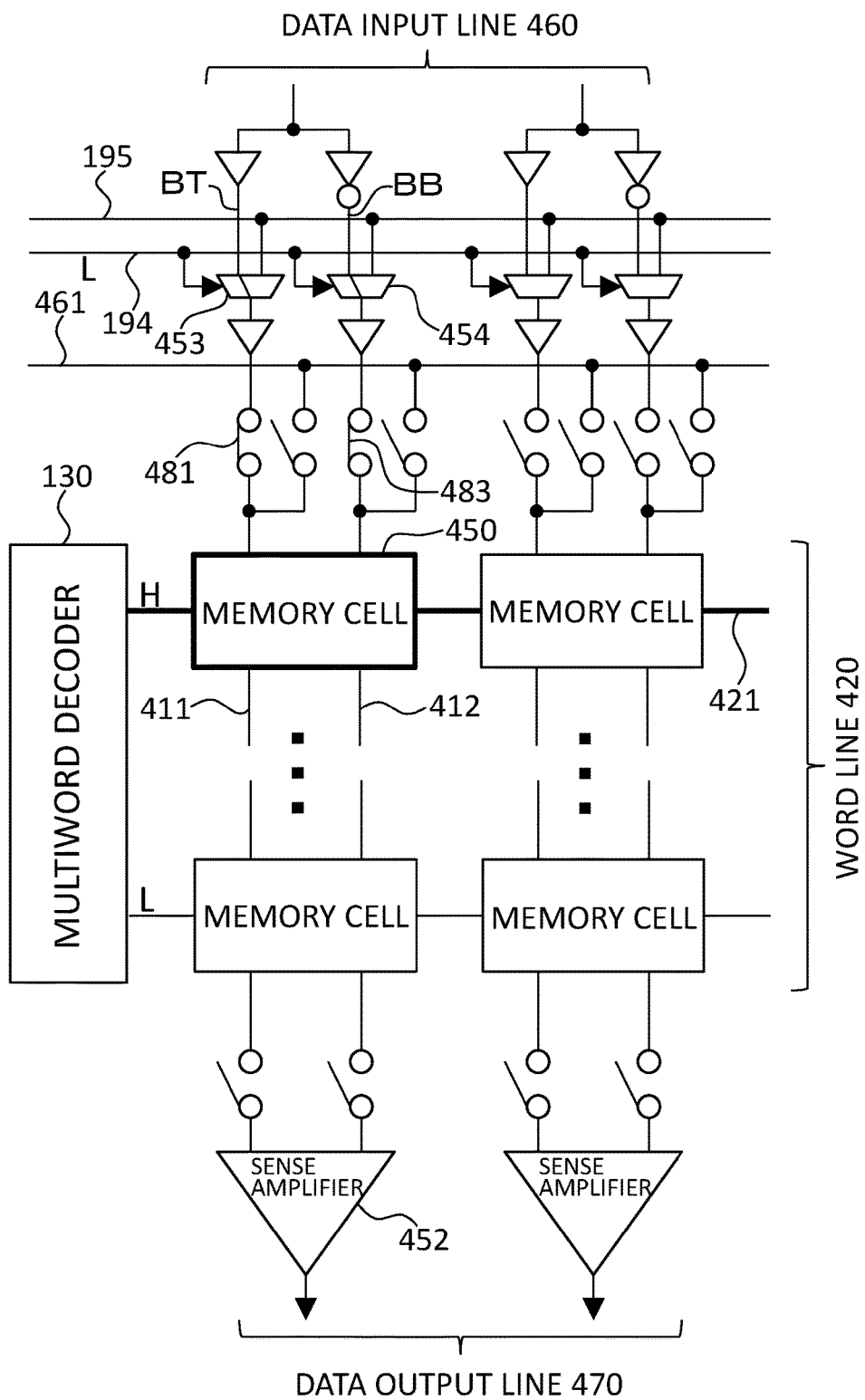
FIG. 17 is a diagram illustrative of a write operation in the Ising chip in the configuration in FIG. 16.

FIG. 17 is the configuration in which in the configuration in FIG. 16, in the write operation to the memory cell 450, the potential of the word line 421 is turned to the "H" level for the selection level, the switching devices 481 and 483 are connected, the selectors 453 and 454 are connected to the bit lines BT and BB for selection, and write data is written through the bit line pairs 411 and 412.

Figure 18:
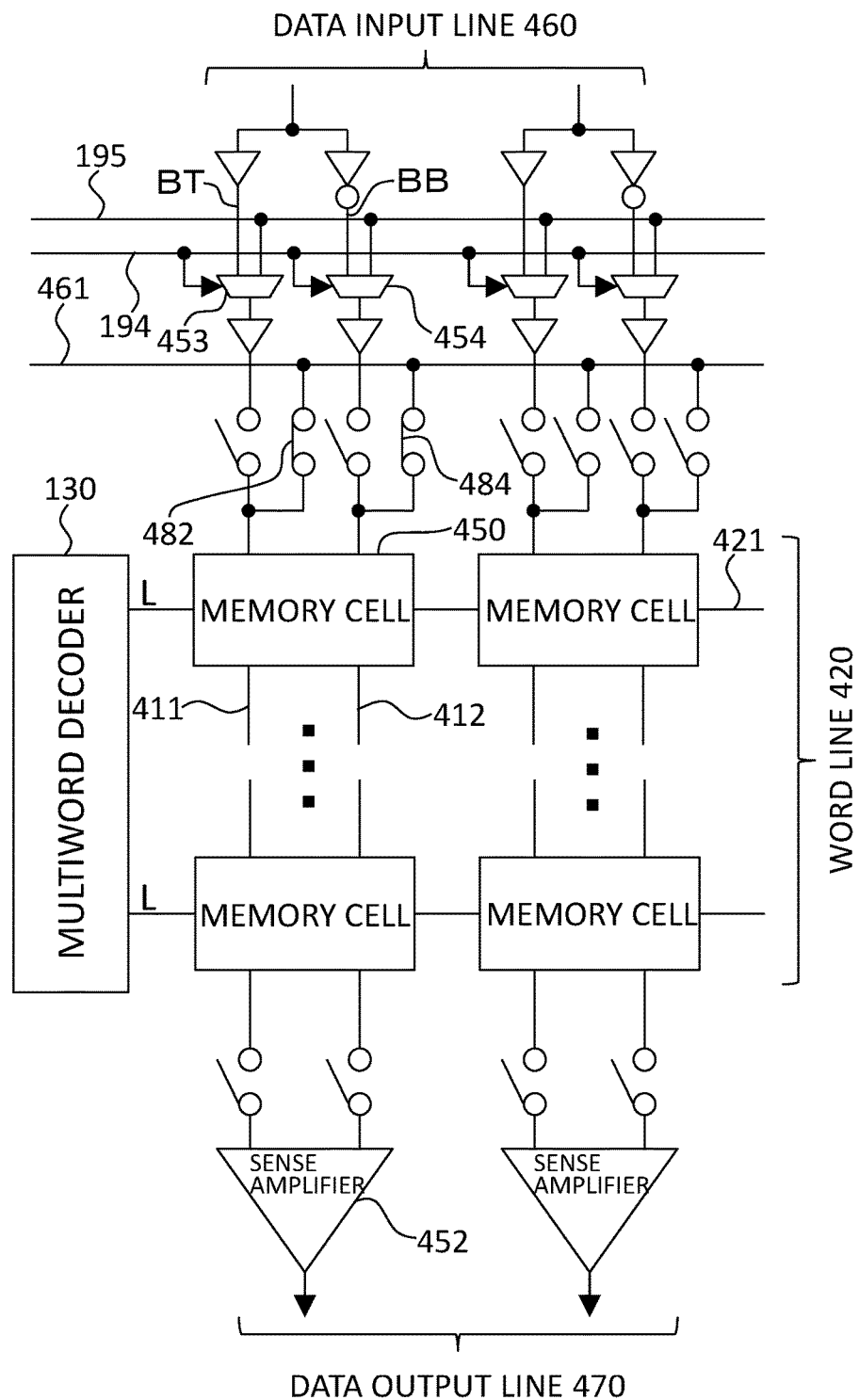
FIG. 18 is a diagram illustrative of a precharge operation in the Ising chip in the configuration in FIG. 16.

FIG. 18 is the configuration in which in the configuration in FIG. 16, prior to the read operation from the memory cell 450, the switching devices 482 and 484 are connected, the precharge voltage line 461 is connected to the bit line pairs 411 and 412, and the voltages of both of the bit lines 411 and 412 are turned to the "H" level.

Figure 19:
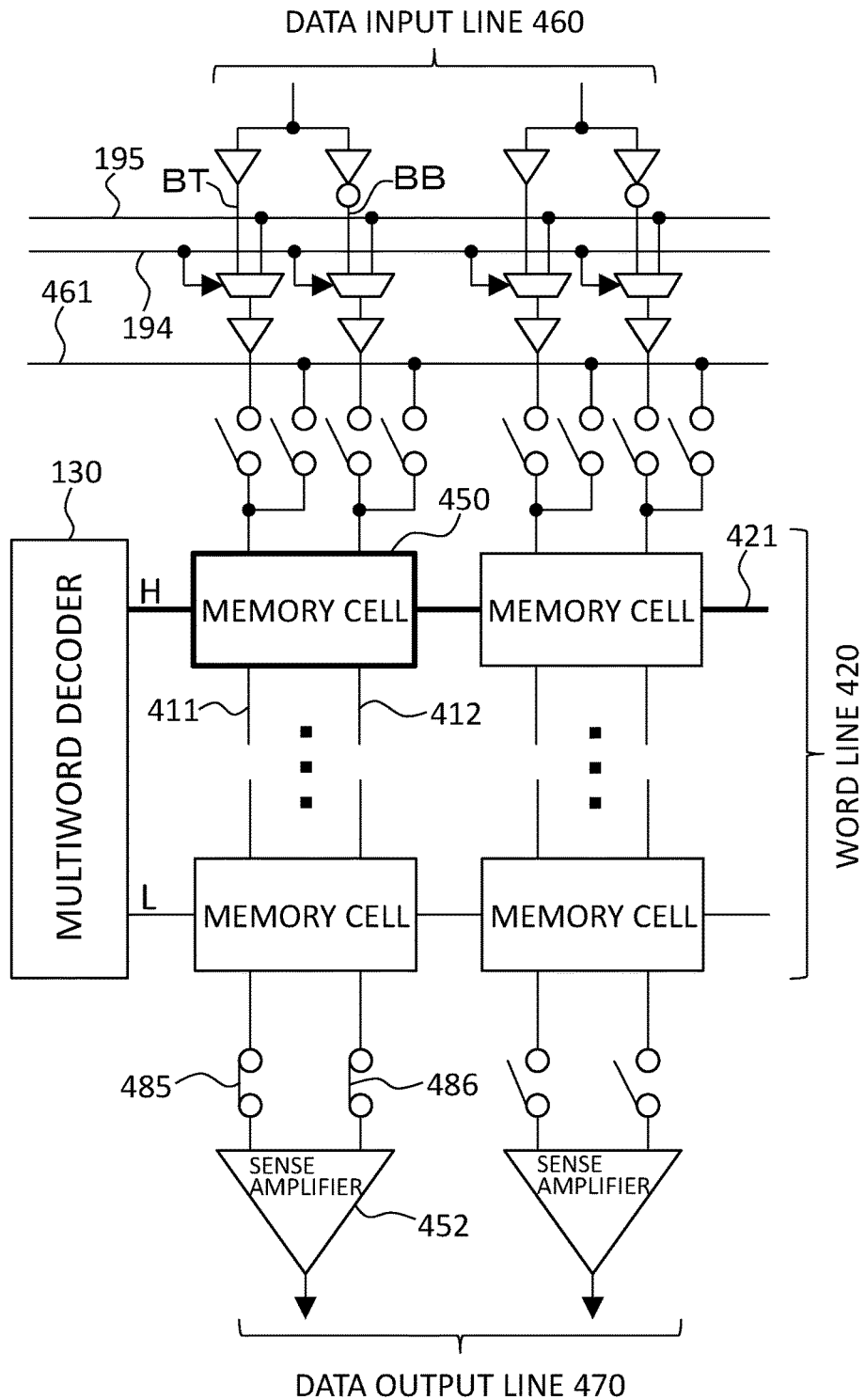
FIG. 19 is a diagram of a configuration in which a memory cell is read upon precharge in the Ising chip in the configuration in FIG. 16.

FIG. 19 is the configuration in which both of the bit lines 411 and 412 in FIG. 18 are precharged, the switching devices 482 and 484 are turned off, the potential of the word line 421 is turned to the "H" level for the selection level, and the potential stored on the memory cell 450 is read to the bit line pairs 411 and 412. The switching devices 485 and 486 are connected, the voltage across the bit line pairs 411 and 412 is amplified at the sense amplifier 452 for detection, and stored data on the memory cell 450 is outputted to the data output line 470.

Figure 20:
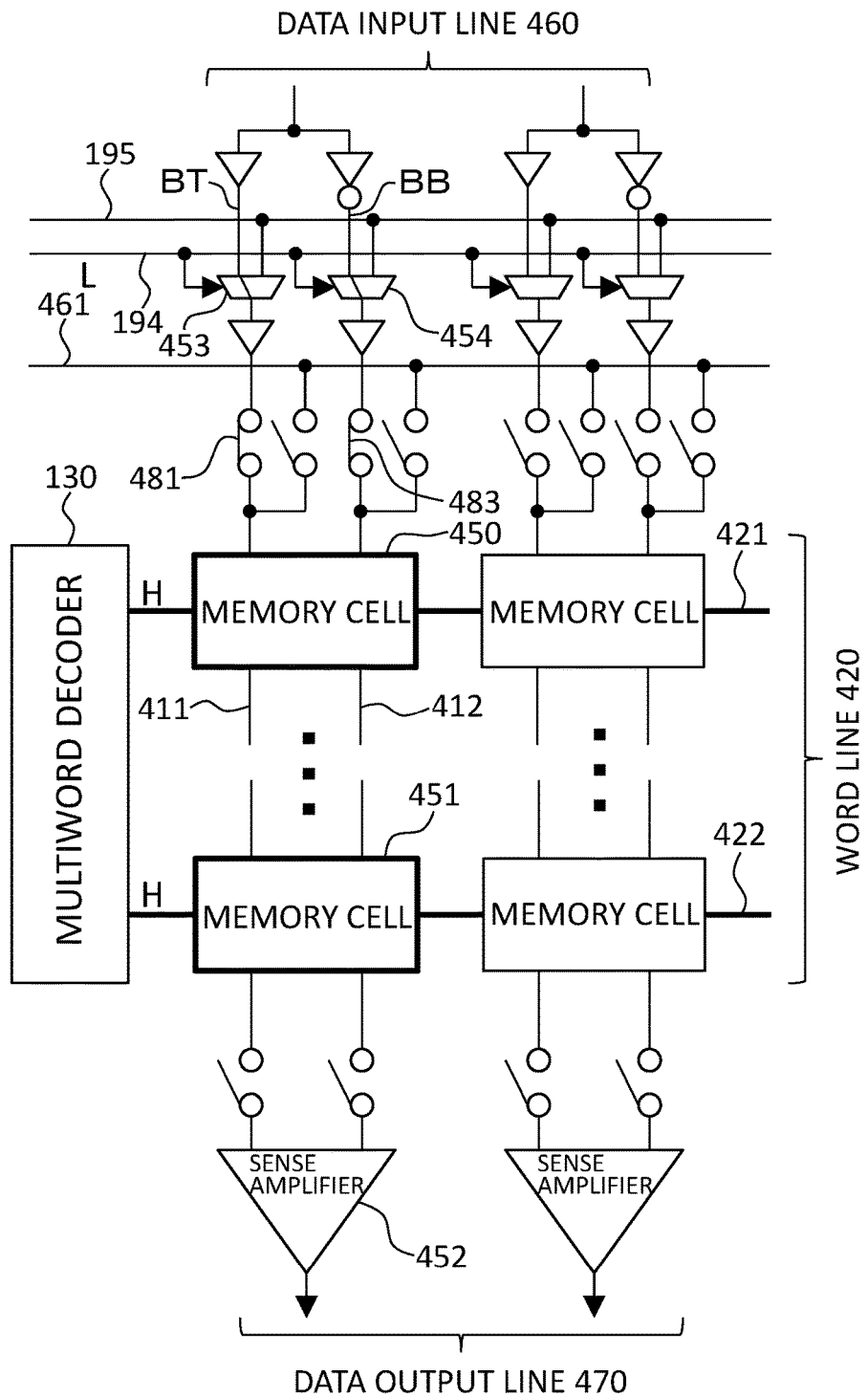
FIG. 20 is a diagram illustrative of a multiword write operation in the Ising chip in the configuration in FIG. 16.

FIG. 20 is the configuration in which in the configuration in FIG. 16, in the multiword write operation to the memory cells 450 and 451, the potential of a plurality of the word lines 421 and 422 is turned to the "H" level for the selection level, the switching devices 481 and 483 are connected, the selectors 453 and 454 are connected to the bit lines BT and BB for selection, and write data is written through the bit line pairs 411 and 412.

Figure 21:
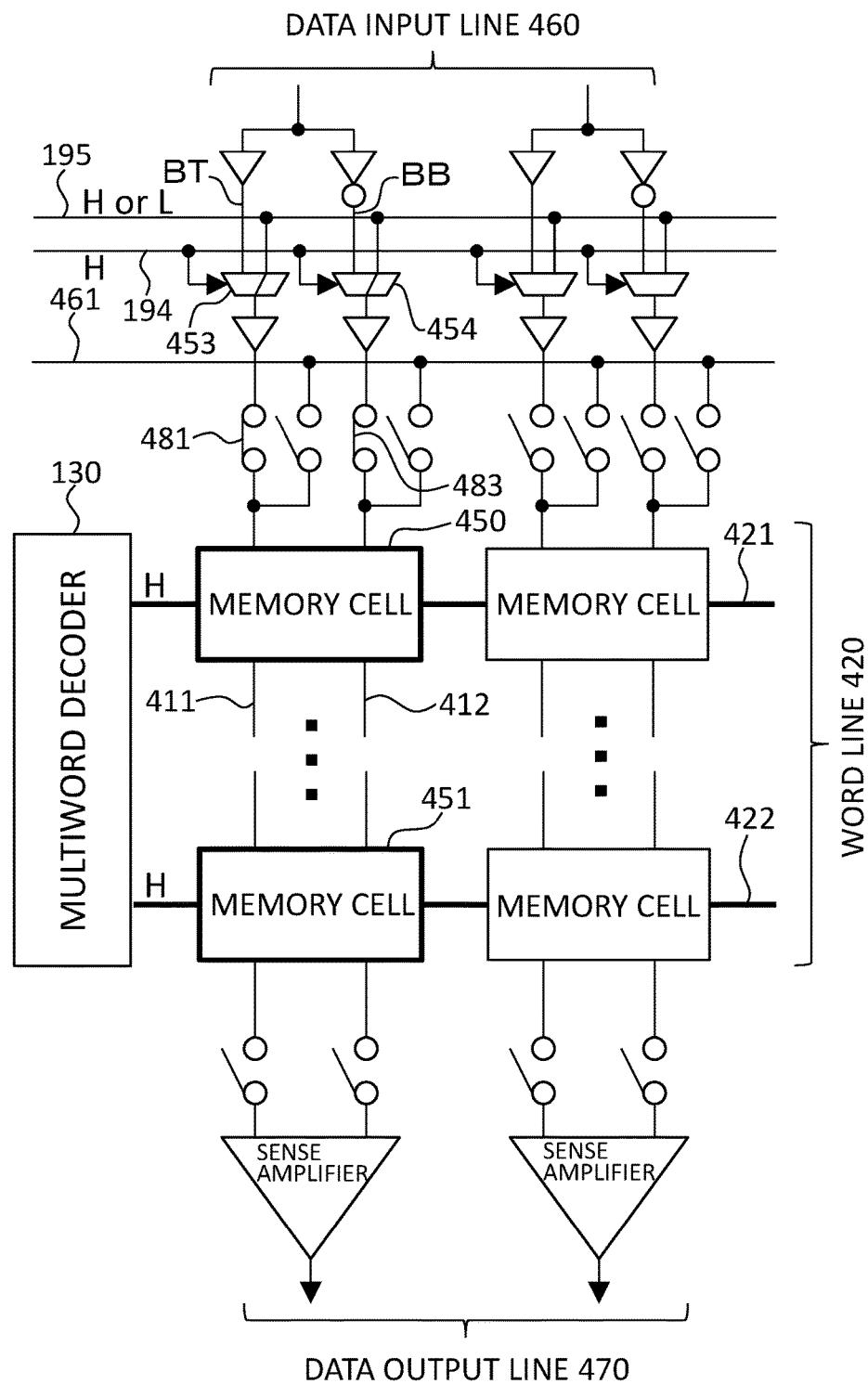
FIG. 21 is a diagram illustrative of a memory cell destruction operation in the Ising chip in the configuration in FIG. 16.

FIG. 21 is the configuration in which in the configuration in FIG. 16, the selectors 453 and 454 are connected to the bit destruction line 195 for selection, the switching devices 481 and 483 are connected, the multiword decoder 130 controls the potential of the word lines 421 and 422 to be turned to the "H" level for the selection level at the same time when the potential of the "H" level, or the "L" level (the ground voltage) externally supplied to the bit destruction line 195 is supplied to both of the bit lines 411 and 412, and the destruction of memory data on the memory cells 450 and 451 can be promoted (the mode is turned to a memory cell memory data destruction mode).

Instead of the destruction operation described above in which the "H" level potential externally supplied to the bit destruction line 195 is supplied to both of the bit lines 411 and 412 to destruct memory data on the memory cells 450 and 451, the similar effect can be expected in which the existing precharge voltage line 461 is connected to the bit line pairs 411 and 412 through the switching devices 482 and 484 and the "H" level potential is supplied to both of the bit lines 411 and 412. However, the potential externally supplied to the bit destruction line 195 can be adjusted to be an optimum potential, and the potential supplied from the precharge voltage line 461 is only a rated potential.

Figure 24:
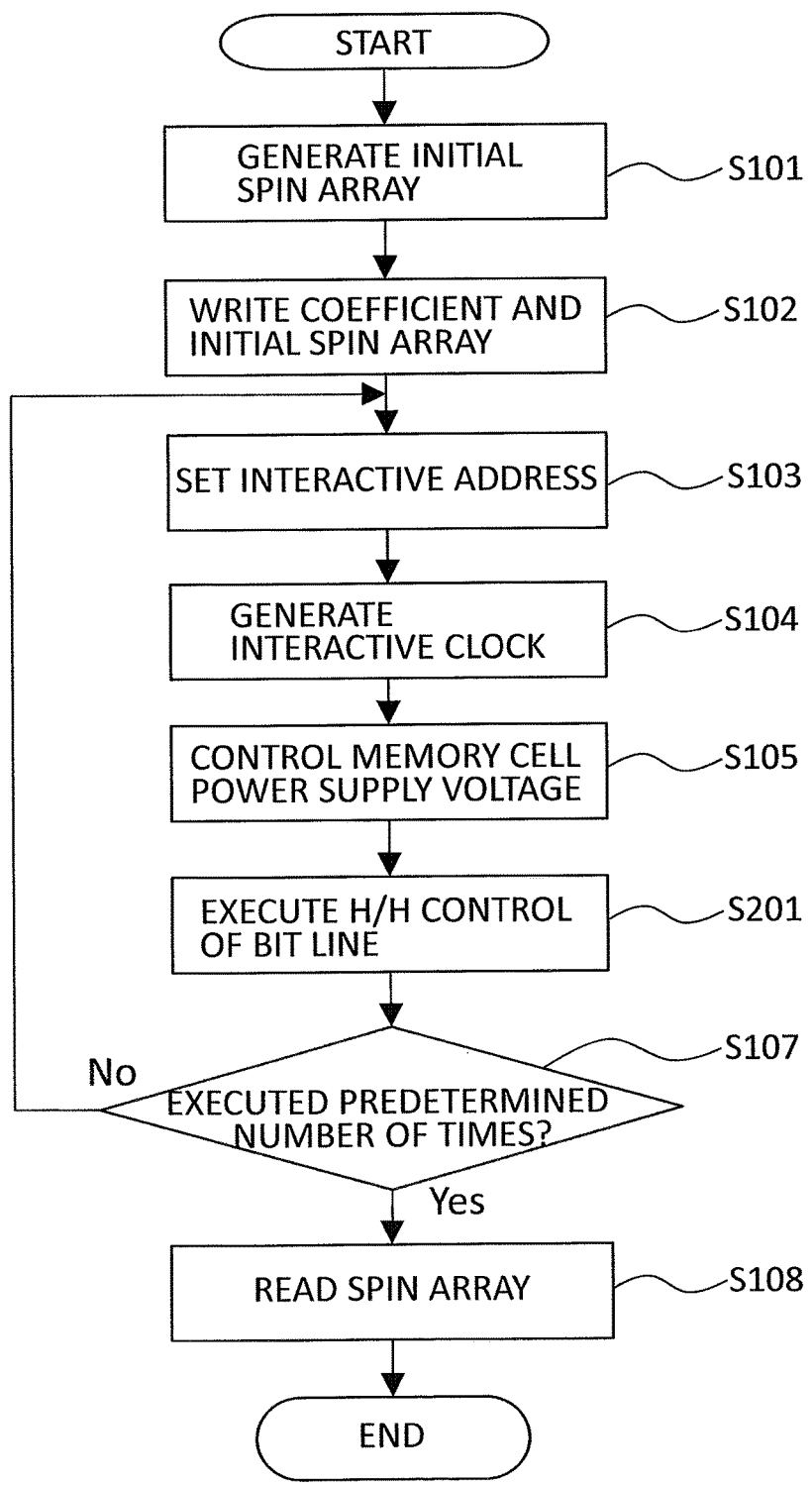
FIG. 24 is a second embodiment of procedures in which a CPU controls the Ising chip to perform a ground state search process on an information processor.

FIG. 24 is a flowchart of procedures in which the CPU 210 controls the Ising chip 100 to perform the ground state search process on the information processor 200 on which the Ising chip 100 is mounted according to the second embodiment. The difference from the flowchart of the first embodiment in FIG. 22 is in that Step S106 is replaced by Step S201.

In Step S201, in the configuration illustrated in FIG. 21, the memory cell N that stores the spins of all the spin units 300 is subjected to the process in which the multiword decoder 130 activates a plurality of the word lines to activate the memory cell at the same time when the "H" level potential externally supplied to the bit destruction line 195 is supplied to both of the bit lines 411 and 412.

Figure 26:
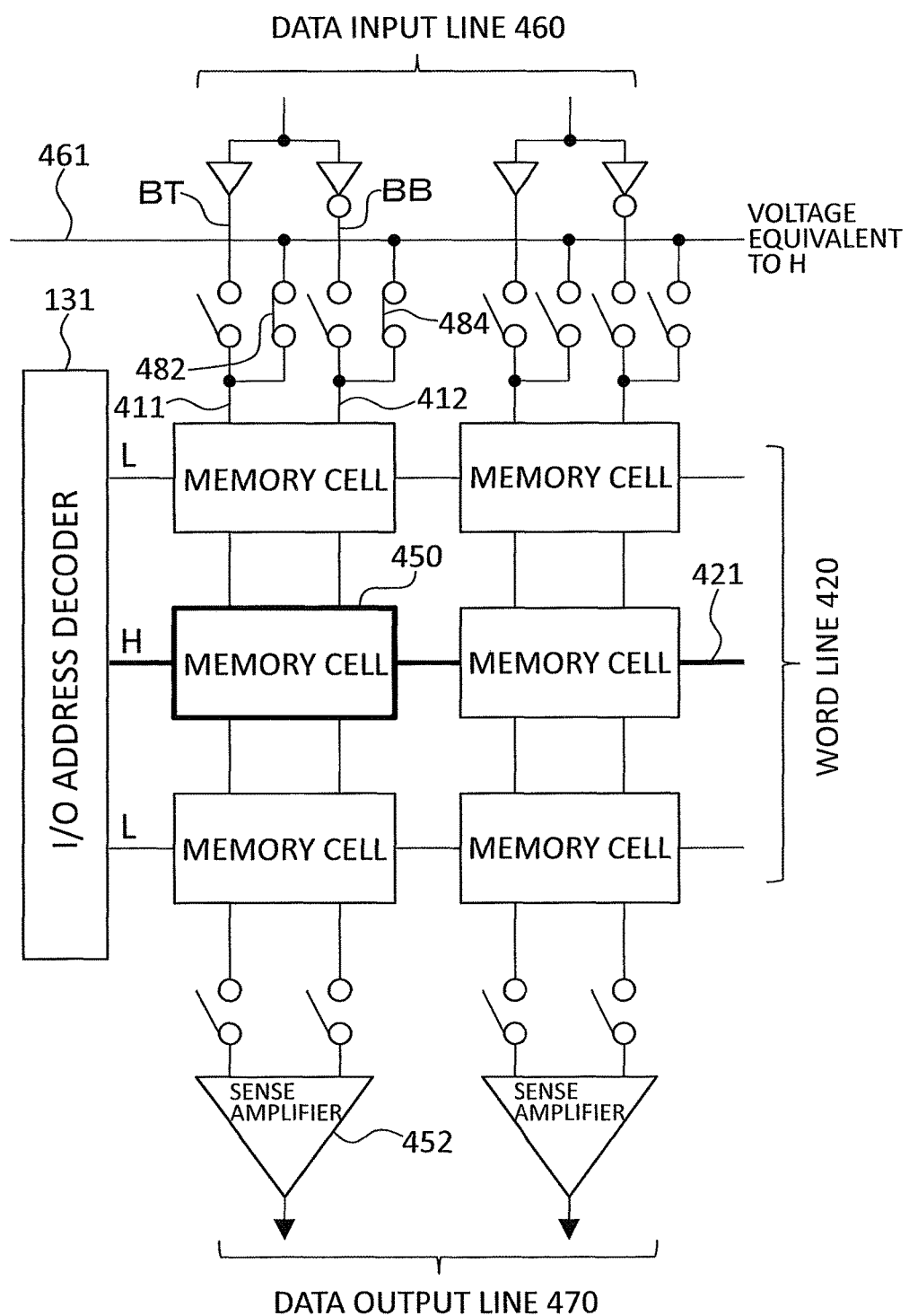
FIG. 26 is a diagram of a configuration in which the precharge operation is used to perform the memory cell destruction operation in the configuration of a typical SRAM included in the Ising chip.

Alternatively, in the configuration illustrated in FIG. 26, the memory cell N that stores the spins of all the spin units 300 is subjected to the process in which the I/O address decoder 131 activates the word line to activate the memory cell at the same time when the precharge voltage line 461 is connected to the bit line pairs 411 and 412 through the switching devices 482 and 484 and the "H" level potential is supplied to both of the bit lines 411 and 412.

Then, lastly, similarly to the case in Step S106, the process is performed in which the value of the power supply voltage 141 supplied to the memory cells of all the spin units 300 configuring the spin array 110 as a voltage specified by the rated value is decreased in Step S105 is returned to the original rated value (a voltage of 1V in the present embodiment).

Third Embodiment

A third embodiment of the scheme for avoiding a local optimal solution in the search for the ground state of the Ising model according to the first and second embodiments is shown.

In the configuration illustrated in FIG. 21, at the same time when the potential of the "L" level (the ground voltage) externally supplied to the bit destruction line 195 is connected to the bit line pairs 411 and 412 through the selectors 453 and 454 and the switching devices 481 and 483 and the potential is supplied, the multiword decoder 130 activates a plurality of the word lines and the memory cell is activated, so that it is possible to destruct the data of the memory cell (the mode is turned to the memory cell memory data destruction mode). In this case, it is unnecessary to use in combination with control to slightly decrease the memory cell power supply voltage 141 according to the first and second embodiments.

It is predicted that the occurrence probability of bit errors can be changed by adjusting the "L" level potential supplied from the bit destruction line 195, including the ground voltage as well as a potential slightly above the ground voltage.

Figure 25:
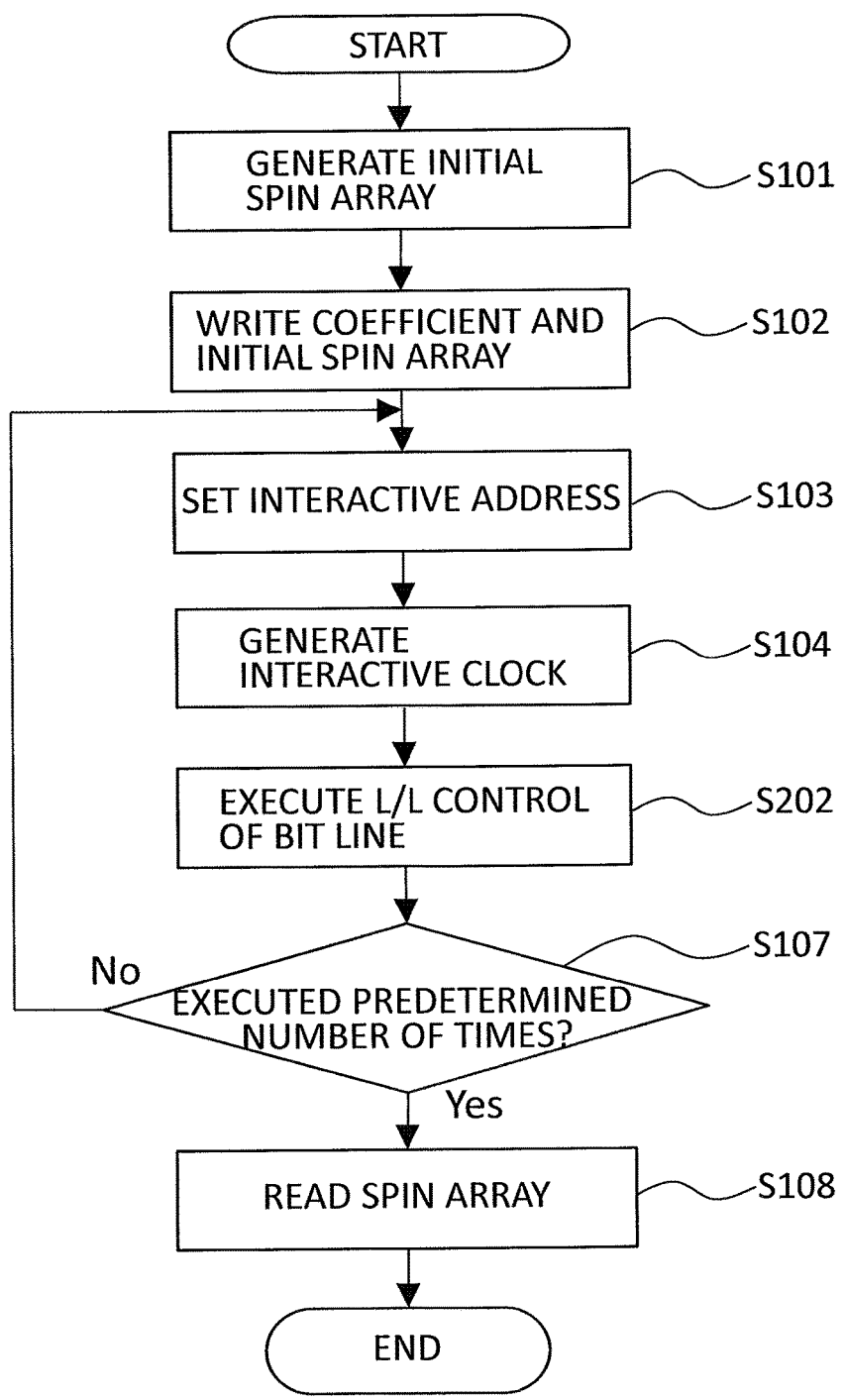
FIG. 25 is a third embodiment of procedures in which a CPU controls the Ising chip to perform a ground state search process on an information processor.

FIG. 25 is a flowchart of procedures according to the third embodiment in which the CPU 210 controls the Ising chip 100 to perform the ground state search process on the information processor 200 on which the Ising chip 100 is mounted. The difference from the flowchart in FIG. 22 according to the first embodiment is that Step S105 and Step S106 are replaced by Step S202.

In Step S202, in the configuration illustrated in FIG. 21, the memory cell N that stores the spins of all the spin units 300 is subjected to the process in which the multiword decoder 130 activates a plurality of the word lines to activate the memory cell at the same time when the "L" level potential externally supplied to the bit destruction line 195 is supplied to both of the bit lines 411 and 412.

What is claimed is:

1. A semiconductor device comprising:
    a memory cell array in which a plurality of memory cells are disposed in a matrix configuration;
    a word line provided in correspondence with rows of the plurality of memory cells;
    a bit line pair provided in correspondence with columns of the plurality of memory cells; and
    a word decoder configured to activate the word line,
    wherein the word line is activated and the bit line pair is fixed to a voltage at the same level;
    wherein the word decoder is a multiword decoder configured to multiplex a word address according to an input of a multiplicity specify signal to the word line and simultaneously activate a plurality of word lines; and
    a driver configured to drive the bit line pair and simultaneously subject the plurality of memory cells activated by the plurality of the word lines to a write operation or a read operation;
    wherein in the memory cell array, a group of a predetermined number of the plurality of memory cells is collected in a unit and a plurality of the units are disposed with an adjacency;
    the plurality of units further include an arithmetic operation circuit configured to receive a value of a memory cell in another unit in adjacency and outputs a value subjected to an arithmetic operation based on the received value and a coefficient stored on an memory cell;
    the memory cell array further includes an address decoder configured to specify the group of units in adjacency that operates the arithmetic operation in synchronization; and
    the arithmetic operation is performed a predetermined number of times for each group of units specified by the address decoder and then a process is repeated in which memory cells of the plurality of units are sequentially activated using the multiword decoder;
    wherein after the arithmetic operation is performed the predetermined number of times, a process is performed in which the plurality of memory cells of the plurality of units are sequentially activated using the multiword decoder and a power supply voltage below a predetermined voltage is supplied to the plurality of memory cells of the plurality of units.

2. The semiconductor device according to claim 1,
    wherein the driver configured to drive the bit line pair further includes a function in which a precharge voltage is connected to the bit line pair and the bit line pair is fixed to an "H" level;
    in a state in which the power supply voltage supplied to the memory cell is decreased below the predetermined voltage, the precharge voltage is connected to the bit line pair, the bit line pair is fixed to an "H" level, and the plurality of word lines are activated using the word decoder.

3. The semiconductor device according to claim 2,
    wherein when a process is performed in which memory cells of the plurality of units are sequentially activated using the multiword decoder, in the process in which a power supply voltage below the predetermined voltage is supplied to the plurality of memory cells of the plurality of units, a decrease in a voltage when a power supply voltage is first supplied is increased to maximum, and in repetitions after that, the decrease is sequentially decreased and converged on zero.

4. The semiconductor device according to claim 2, wherein after the arithmetic operation is performed the predetermined number of times, a process is performed in which the plurality of memory cells of the plurality of units are sequentially activated using the multiword decoder and a bit destruction line connected to an external interface is connected to the bit line pair wherein the bit line pair is fixed to an "L" level.

5. The semiconductor device according to claim 1, wherein the driver configured to drive the bit line pair further includes a function in which a bit destruction line is externally connected and the bit line pair is fixed to an "H" level;
in a state in which the power supply voltage supplied to the memory cell is decreased below the predetermined voltage, the bit destruction line is connected to the bit line pair, the bit line pair is fixed to an "H" level, and the plurality of word lines are activated using the word decoder.

6. The semiconductor device according to claim 1, wherein the driver configured to drive the bit line pair further includes a function in which a bit destruction line is externally connected and the bit line pair is fixed to an "L" level; and
the word lines are activated using the word decoder.

7. The semiconductor device according to claim 6, wherein when a process is performed in which memory cells of the plurality of units are sequentially activated using the multiword decoder, in the process in which a power supply voltage below the predetermined voltage is supplied to the plurality of memory cells of the plurality of units, a decrease in a voltage when a power supply voltage is first supplied is increased to maximum, and in repetitions after that, the decrease is sequentially decreased and converged on zero.

8. The semiconductor device according to claim 6, wherein after the arithmetic operation is performed the predetermined number of times, a process is performed in which the plurality of memory cells of the plurality of units are sequentially activated using the multiword decoder and a bit destruction line connected to an external interface is connected to the bit line pair wherein the bit line pair is fixed to an "L" level.

9. The semiconductor device according to claim 1, wherein according to the inputted multiplicity specify signal, the multiword decoder generates a variation of a last digit of an address to a reference word address, and simultaneously activates the plurality of word lines.

10. The semiconductor device according to claim 1, wherein when a process is performed in which memory cells of all the units are sequentially activated using the multiword decoder, in the process in which a power supply voltage below a predetermined voltage is supplied to memory cells of all the units, a decrease in a voltage when a power supply voltage is first supplied is increased to maximum, and in repetitions after that, a decrease is sequentially decreased and converged on zero.

11. The semiconductor device according to claim 1, wherein after the arithmetic operation is performed the predetermined number of times, a process is performed in which the plurality of memory cells of the plurality of units are sequentially activated using the multiword decoder and a bit destruction line connected to an external interface is connected to the bit line pair wherein the bit line pair is fixed to an "L" level.

* * * * *